(12) United States Patent
Ozasa et al.

(10) Patent No.: US 7,215,195 B2
(45) Date of Patent: May 8, 2007

(54) DIFFERENTIAL AMPLIFIER AND OPERATIONAL AMPLIFIER

(75) Inventors: Masayuki Ozasa, Kyoto (JP); Akio Yokoyama, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/518,919

(22) Filed: Sep. 12, 2006

(65) Prior Publication Data

US 2007/0001761 A1 Jan. 4, 2007

Related U.S. Application Data

(62) Division of application No. 10/510,388, filed as application No. PCT/JP03/12922 on Oct. 8, 2003, now Pat. No. 7,116,170.

(30) Foreign Application Priority Data

Oct. 8, 2002 (JP) .............................. 2002-295098

(51) Int. Cl.
*H03F 3/45* (2006.01)
(52) U.S. Cl. ........................................ 330/253; 330/69
(58) Field of Classification Search .................... None
See application file for complete search history.

(56) References Cited

U.S. PATENT DOCUMENTS 4,918,398 A 4/1990 Huijsing et al.

(Continued)

FOREIGN PATENT DOCUMENTS

JP 6-169227 A 6/1994

(Continued)

OTHER PUBLICATIONS

Tamai, Tokumichi., "Semiconductor Circuit Design Technology." Nikkei BP, Inco., First Edition, Nov. 16, 1990, pp. 308-311 (Including Partial English Translation).

(Continued)

*Primary Examiner*—Khanh Van Nguyen
(74) *Attorney, Agent, or Firm*—McDermott Will & Emery LLP

(57) ABSTRACT

In a differential amplifier and an operational amplifier each for amplifying a signal, a differential signal composed of first and second signals is inputted to a couple of input terminals (1, 2). When the voltage of the first signal is, e.g., less than the voltage value of a reference voltage source (15), a comparator (13) senses it and a switch circuit (12) switches to a first current source (6) and a current from a third current source (11) flows into the first current source (6) so that a current is inhibited from flowing in the first differential couple (4). As a result, the inputted differential signal is amplified and outputted only through a second differential couple (5). In a situation in which the voltage of the first signal exceeds the voltage of the reference voltage source (15), on the other hand, the switch circuit (12) switches to a current source (7) so that the inputted differential signal is amplified and outputted only through the first differential couple (4). As a result, a gain is equal over the entire range of input operating voltage and a high-speed operation is performed.

4 Claims, 35 Drawing Sheets

U.S. PATENT DOCUMENTS 5,886,578 A      3/1999   Miyashita et al.
7,126,419 B2 *  10/2006  Miyasita .................... 330/69

FOREIGN PATENT DOCUMENTS

| JP | 8-18354 A | 1/1996 |
|---|---|---|
| JP | 8-18355 A | 1/1996 |
| JP | 9-74322 A | 3/1997 |
| JP | 11-500883 A | 1/1999 |
| JP | 11-355066 A | 12/1999 |
| JP | 6-90125 A | 3/2004 |
| WO | WO 97/06595 | 2/1997 |

OTHER PUBLICATIONS

Gray, Paul, R., et al. "Analysis and Design of Analog Integrated Circuits." John Wiley & Sons, Inc. Third Edition. Chapter 3, Single Transistor and Two-Transistor Amplifiers, 1993, pp. 244-249.

* cited by examiner

US 7,215,195 B2

DIFFERENTIAL AMPLIFIER AND OPERATIONAL AMPLIFIER

RELATED APPLICATIONS

This application is a divisional of application Ser. No. 10/510,388, filed Oct. 7, 2004, now U.S. Pat. No. 7,116,170, which is a 371 Application PCT/JP03/12922, filed Oct. 8, 2003, based on Japanese Patent Application No. 2002-295098, filed Oct. 8, 2002, and the contents of which are hereby incorporated by reference.

TECHNICAL FIELD

The present invention relates to a differential amplifier and an operational amplifier used as amplifiers in electronic equipment or semiconductor integrated circuits.

BACKGROUND ART

As differential amplifiers used as amplifiers in electronic equipment and semiconductor integrated circuits, there are conventional ones disclosed in Document 1 ("Semiconductor Circuit Design Technology," compiled under the supervision of Tokumichi Tamai, Nikkei BP, Inco., First Edition, Page 308) and Document 2 ("Analysis and Design of Analog Integrated Circuits," Paul R. Gray and Robert G Meyer, John Wiley & Sons, Inc., Third Edition, Page 244).

FIG. 29 shows a circuit diagram of a conventional differential amplifier as disclosed in Document 1 or 2. In the drawing, 1 and 2 are first and second input terminals to which a differential signal is inputted, M1 and M2 are n-channel MOS transistors for composing a differential couple and receiving the signals inputted to the first and second input terminals, M3 is an n-channel MOS transistor for composing a tail current source for the differential amplifier, NGB is a gate voltage application terminal for operating the n-channel MOS transistor as a current source, VSS is a negative power source for the circuit or a terminal to which the ground is applied, and 16 and 17 are output terminals for outputting signals converted to currents by the differential couple M1 and M2.

A description will be given to a differential amplifier thus constructed. A current in the n-channel MOS transistor M3 is distributed between the two n-channel MOS transistors M1 and M2 depending on a voltage difference between two signals composing the differential signal inputted to the first and second input terminals 1 and 2. When the two signals composing the differential signal have equal input voltages, a current conversion rate is defined as a conductance gm and, if the conductance gm of each of the n-channel MOS transistors composing the differential couple is assumed to be gmn, the gmn is expressed as $$gmn = Ids/(Vgs - Vthn)$$

where Ids is a current flowing in the MOS transistor, Vgs is a gate-source voltage, and Vthn is the threshold voltage of the n-channel MOS transistor.

When the respective voltages of the input signals are low, however, a flowing current is reduced disadvantageously because the n-ch MOS transistor M3 operates in a non-linear region so that an intrinsic operation is not obtainable. Thus, the conventional circuit of FIG. 29 has a drawback that the range of the input operating voltage is limited to a voltage range within which the n-channel MOS transistor M3 composing the tail current source operates in a saturation region.

FIG. 30 shows a differential amplifier which implements the same function as the conventional circuit of FIG. 29 by using p-channel MOS transistors. In the drawing, 1 and 2 are input terminals, M22 and M23 are p-channel MOS transistors composing a differential couple, M24 is a p-channel MOS transistor composing a tail current source for the differential amplifier, PGB is a gate voltage application terminal for operating the p-channel MOS transistor as the current source, VDD is a terminal to which a positive power source for the circuit is applied, and 34 and 35 are output terminals for outputting the signals converted to currents.

In the differential amplifier thus constructed also, the current conversion rate is obtained as the conductance gm in the same manner as in the circuit composed of the n-channel MOS transistors. Accordingly, if the conductance gm of each of the p-channel MOS transistors is assumed to be gmp, the gmp is expressed as $$gmp = Ids/(Vsg - Vthp)$$

where Ids is a current flowing in the MOS transistor, Vsg is a source-gate voltage, and Vthp is the threshold voltage of the p-channel MOS transistor.

If the input voltages to the differential amplifier shown in FIG. 30 are high, however, the p-channel MOS transistor M24 operates in a linear region so that a current flowing therein is reduced disadvantageously and an intrinsic operation is not obtainable. Accordingly, the differential amplifier of FIG. 30 also has a drawback that the range of the input operating voltage is limited to a voltage range within which the p-channel MOS transistor M24 composing the tail current source operates in the saturation region.

Thus, each of the differential amplifiers shown in FIGS. 29 and 30 has the problem that the range of the input operating voltage is limited.

As an amplifier which operates in the entire range of the input operating voltage and thereby solves such a problem, there is a conventional one disclosed in Document 3 (Domestic-Phase PCT Patent Application No. HEI 11-500883).

FIG. 31 is a circuit diagram of a differential amplifier as a part of the amplifier disclosed in Patent Document 3 mentioned above. In FIG. 31, M6 and M7 are n-channel MOS transistors composing a differential couple, M27 and M28 are p-channel MOS transistors composing a differential couple, 67, 32, and 36 are tail current sources for composing respective differential amplifiers, 27 and 38 are current sources for canceling out currents from the tail current sources for the differential amplifiers, M25 and M26 are n-channel MOS transistors for sensing the respective operating states of the tail current sources 6 and 7 and causing the ON/OFF operation of the current source 38, and M29 and M30 are p-channel MOS transistors for sensing the respective operating states of the tail current sources 32 and 36 and causing the ON/OFF operation of the current source 27.

FIG. 32 is a block diagram for illustrating the operation of the amplifier of Document 3 mentioned above. In the drawing, 4 is a differential couple composed of n-channel MOS transistors M1 and M2, 5 is a differential couple composed of the n-channel MOS transistors M6 and M7, 30 is a differential couple composed of the p-channel MOS transistors M27 and M28, 31 is a differential couple composed of p-channel MOS transistors M22 and M23, 28 is a switch composed of the p-channel MOS transistors M29 and M30, 29 is a switch generated by the operation of the n-channel MOS transistors M6 and M7, 37 is a switch composed of the n-channel MOS transistors M25 and M26, 33 is a switch generated by the operation of the p-channel MOS transistors M22 and M23, 10 is a current synthesis and amplification circuit for synthesizing and amplifying currents outputted from the output terminals of the differential amplifiers.

A description will be given to the operation of the differential amplifiers thus constructed. In the amplifier of Document 3, the problem of each of the conventional circuits already described with reference to FIGS. 29 and 28, which is the limited operation range of the input voltage to the differential amplifier, has been solved by operating the differential couple of the n-channel MOS transistors and the differential couple of the p-channel MOS transistors in combination. Specifically, in the amplifier of Document 3, the differential couples 30 and 31 operate at a voltage in the vicinity of that of the negative power source VSS for the circuit, the differential couples 5 and 30 operate at an intermediate voltage, and the differential couples 4 and 5 operate at a high voltage in the vicinity of that of the positive power source VDD for the circuit. Accordingly, there are three expressions for the conversion rate gm of the differential amplifier in correspondence with the three cases. In the vicinity of the ground potential VSS, the conversion rate is expressed as $gm=2 \cdot gmp$.

At the intermediate voltage, the conversion rate is expressed as $gm=gmn+gmp$.

In the vicinity of the power source voltage VDD, the conversion rate is expressed as $gm=2 \cdot gmn$.

Thus, the differential amplifier composing the amplifier of Document 3 mentioned above is operable in the entire range of the input voltage but is required to satisfy a relationship represented by $gmn=gmp$ such that the conversion rate gm of each of the differential amplifiers is held constant. However, the relationship cannot necessarily be satisfied if variations in a diffusion process are taken into consideration. Thus, the differential amplifiers composing the amplifier of Document 3 have the drawback that, to hold the conversion rate constant over the entire range of the input voltage, the necessity to equate the characteristics of the n-channel MOS transistors with those of the p-channel MOS transistors, though the differential amplifiers composing the amplifier of Document 3 are operable over the entire range of the input voltage. In addition, the output mode of the differential amplifier of Document 3 is an output voltage in the vicinity of the VDD with the differential couple composed of n-channel MOS transistors, while it is an operating voltage in the vicinity of the VSS with the differential couple composed of p-channel MOS transistors, so that currents having different operating voltage points should be synthesized and the synthesis of the currents becomes complicated.

As the amplifier operating over the entire range of the input operating voltage, there is also a conventional one disclosed in Document 4 (Japanese Laid-Open Patent Publication No. HEI 8-18355).

FIG. 33 shows a circuit diagram of a differential amplifier which is a part of the operational amplifier disclosed in Document 4. In FIG. 33, M5 and M10 are p-channel MOS transistors for level-shifting input signals, M1 and M2 are n-channel MOS transistors composing a differential couple, M6 and M7 are n-channel MOS transistors composing another differential couple, 6 and 7 are tail current sources for composing differential amplifiers, and 39 and 40 are current sources for driving the p-channel MOS transistors.

FIG. 34 is a block diagram for illustrating the operation of the operational amplifier of Document 4 which is shown specifically in FIG. 33. In the drawing, 8 and 9 are level shift circuits for shifting the voltages levels of differential signal, 4 and 5 are a differential couple composed of n-channel MOS transistors, 10 is a circuit for synthesizing and amplifying currents outputted from the output terminals of the differential amplifier, and 3 is an output of the operational amplifier.

A description will be given to the operation of the differential amplifier of Document 4 thus constructed. In the operational amplifier of Document 4, the differential couple composed of the n-channel MOS transistors and the level shift circuits are combined to operate, whereby the conventional problem illustrated with reference to FIG. 29, which is the limited range of the input operating voltage of the differential amplifier, is solved. That is, in the operational amplifier of Document 4, the differential couple 5 operates at a voltage in the vicinity of the negative power source VSS for the circuit, the differential couples 4 and 5 operate at an intermediate voltage, and the differential couple 4 operates at a high voltage in the vicinity of the positive power source VDD for the circuit. Thus, there are three expressions for the conversion rate gm of the differential amplifier in correspondence with the three cases. In the vicinity of the ground potential VSS, the conversion rate is expressed as $gm=gmn$.

At the intermediate voltage, the conversion rate is expressed as $gm=2 \cdot gmn$.

In the vicinity of the power source voltage VDD, the conversion rate is expressed as $gm=gmn$.

Therefore, the differential amplifier composing the operational amplifier of Document 4 mentioned above is operable over the entire range of the input voltage but, even if the respective conversion rates of the differential couples 4 and 5 are changed, the conversion rate of the differential amplifier cannot be held constant. Accordingly, the differential amplifier composing the operational amplifier of Document 4 has the drawback that the conversion rate cannot be held constant over the entire range of the input voltage.

Against this backdrop, a conventional differential amplifier capable of operating over the entire range of the input voltage and also holding constant the conversion rate over the entire range of the input voltage is disclosed in Document 5 (Japanese Laid-Open Patent Publication No. HEI 8-18354).

FIG. 35 shows a circuit diagram of the differential amplifier composing an operational amplifier of FIG. 5. In the drawing, M31, M33, M35, M36, and M37 are a differential amplifier and a diode load each for measuring a current variation resulting from the voltage level of the differential signal, M32, M34, M38, and M39 are p-channel MOS transistors composing a current subtract circuit, and M40 and M41 are n-channel MOS transistors composing the current subtract circuit. The other circuit structure is the same as in FIG. 33.

FIG. 36 shows a block diagram for illustrating the operation of the operational amplifier of Document 5. In the drawing, 41 is a current measure circuit for measuring a current variation resulting from the voltage level of the differential signal, 42 is a current subtract circuit for subtracting a current sensed by the current measure circuit 41 from an intrinsic current, and M8 is a tail current source controlled by an output of the current subtract circuit 42.

A description will be given to the operation of the differential amplifier of Document 5 thus constructed. In the operational amplifier of Document 5, the differential couple composed of the n-channel MOS transistors and the level shift circuit are combined to operate, whereby the foregoing conventional problem described with reference to FIG. 29, which is the limited range of the input operating voltage of the differential amplifier, is solved. That is, in the operational amplifier of Document 5, the differential couple 5 operates at a voltage in the vicinity of a negative power source VSS for the circuit, only the current differential couple 4 operates at an intermediate voltage by stopping the current in the n-channel MOS transistor M8 by using the current sense circuit 41 and the current subtract circuit 42, and the differential couple 4 operates even at a high voltage in the vicinity of the positive power source VDD for the circuit. Thus, there are two expressions for the conversion rate gm of the differential amplifier in correspondence with the two cases. In the vicinity of the ground potential VSS, the conversion rate is expressed as gm=gmn.

At the intermediate voltage and in the vicinity of the power source potential VDD, the conversion rate is expressed as gm=gmn.

Hence, the differential amplifier composing the operational amplifier of Document 5 is capable of operating over the entire range of the input voltage and the conversion rate thereof can be held constant.

Problem To Be Solved

However, the differential amplifier of Document 5 has the drawback that it cannot respond quickly to high-speed and large-amplitude input signals. This is because current mirror circuits ((M31 and M32), (M38 and M39)) are used for the current measure circuit 41 and the current subtract circuit 42. The current mirror circuit has the drawback that charge accumulated in the gate capacitance of each of the MOS transistors cannot be extracted swiftly during the ON-to-OFF operation thereof and the operating speed is lowered, though an expected operating speed is guaranteed for the current mirror circuit during the OFF-to-ON operation thereof. Thus, the differential amplifier composing the operational amplifier of Document 5 has the drawback that it cannot operate at a high speed.

DISCLOSURE OF THE INVENTION

The present invention is for solving the foregoing conventional problems and an object thereof is to enable a differential amplifier and an operational amplifier to have an equal gain over the entire range of the input operating voltage and operate at a high speed upon amplifying a signal.

To attain the foregoing object, the differential amplifier and operational amplifier according to the present invention do not use a current measure circuit nor a current subtract circuit having a current mirror circuit in the structure comprising the two differential couples, the current source, and the two level shift circuits as in the amplifier of Document 4 shown in FIG. 34 and an amplifier having the same function is constructed by using a comparator not having a current mirror circuit and a switch instead.

Specifically, a differential amplifier according to the present invention is characterized in that it comprises: first and second input terminals to which a differential signal composed of first and second signals is inputted; first and second level shift circuits for shifting respective voltages of the first and second signals inputted to the first and second input terminals; a first differential couple and a first current source for converting the differential signal level-shifted by the first and second level shift circuits to currents; a second differential couple and a second current source for converting the differential signal inputted to the first and second input terminals to currents; a third current source and a reference voltage source; a comparator for comparing the voltage of the first or second signal inputted to the first or second input terminal with a voltage of the reference voltage source; a switch circuit for selectively supplying a current from the third current source to the first or second current source depending on a result of the comparison by the comparator; and first and second output terminals to which an output of the first differential couple and an output of the second differential couple are connected commonly.

The differential amplifier according to the present invention is also characterized in that it further comprises: third and fourth level shift circuits for shifting the respective voltages of the first and second signals inputted to the first and second input terminals, wherein the second differential couple and the second current source convert the differential signal level-shifted by the third and fourth level shift circuits to currents instead of the differential signal inputted to the first and second input terminals.

The differential amplifier according to the present invention is also characterized in that it comprises: first and second input terminals to which a differential signal composed of first and second signals is inputted; first and second level shift circuits for shifting respective voltages of the first and second signals inputted to the first and second input terminals; a reference voltage source; first and second voltage limit circuits for limiting the voltage of the differential signal level-shifted by the first and second level shift circuits with a voltage of the reference voltage source; a first differential couple and a first current source for converting the differential signal having the voltage limited by the first and second voltage limit circuits to currents; a second differential couple and a second current source for converting the differential signal inputted to the first and second input terminals to currents; a third current source; a comparator for comparing the voltage of the first or second signal inputted to the first or second input terminal with the voltage of the reference voltage source; a switch circuit for selectively supplying a current from the third current source to the first or second current source depending on a result of the comparison by the comparator; and first and second output terminals to which an output of the first differential couple and an output of the second differential couple are connected commonly.

In addition, the differential amplifier according to the present invention is characterized in that it further comprises: third and fourth level shift circuits for shifting the respective voltages of the first and second signals inputted to the first and second input terminals, wherein the second differential couple and the second current source convert the differential signal level-shifted by the third and fourth level shift circuits to currents instead of the differential signal inputted to the first and second input terminals.

Additionally, the differential amplifier according to the present invention is also characterized in that it further comprises: a fourth current source; a second comparator for comparing the voltage of the first or second signal inputted to the first or second input terminal with the voltage of the reference voltage source; and a second switch circuit for selectively supplying a current from the fourth current source to the first current source or the second current source depending on a result of comparison by the second comparator.

The differential amplifier according to the present invention is also characterized in that it further comprises: a fourth current source; a second comparator for comparing the voltage of the first or second signal inputted to the first or second input terminal with the voltage of the reference voltage source; and a second switch circuit for selectively supplying a current from the fourth current source to the first current source or the second current source depending on a result of comparison by the second comparator.

Further, the differential amplifier according to the present invention is characterized in that it comprises: first and second input terminals to which a differential signal composed of first and second signals is inputted; first and second level shift circuits for shifting respective voltages of the first and second signals inputted to the first and second input terminals; a reference voltage source; first and second voltage limit circuits for limiting the voltage of the differential signal level-shifted by the first and second level shift circuits with a voltage of the reference voltage source; a first differential couple and a first current source for converting the differential signal having the voltage limited by the first and second voltage limit circuits to currents; third and fourth level shift circuits for shifting the respective voltages of the first and second signals inputted to the first and second input terminals; third and fourth voltage limit circuits for limiting the voltage of the differential signal level-shifted by the third and fourth level shift circuits with the voltage of the reference voltage source; a second differential couple and a second current source for converting the differential signal having the voltage limited by the third and fourth voltage limit circuits to currents; and first and second output terminals to which an output of the first differential couple and an output of the second differential couple are connected commonly.

In addition, the differential amplifier according to the present invention is characterized in that the comparator and the switch circuit comprise: a first transistor having a gate for receiving the first or second signal inputted to the first or second input terminal; and a second transistor having a gate to which the reference voltage source is connected and the first and second transistors have respective one terminals connected commonly to the third current source and the respective other terminals connected to the first and second current sources.

Additionally, an operational amplifier according to the present invention is characterized in that it comprises: the differential amplifier; and a current synthesis and amplification circuit for synthesizing and amplifying current outputs of the differential amplifier.

In the foregoing structure according to the present invention, when the voltage of one of the first and second signals composing the differential signal, e.g., the voltage of the first signal is less than the voltage of the reference voltage source, the switch circuit switches to, e.g., the first power source side through the sensing of the comparator and a current from the third current source flows into the first current source so that the current is inhibited from flowing in the first differential couple. As a result, the inputted differential signal is outputted only through the second differential couple. In a situation in which the voltage of the first signal is exceeding the voltage of the reference voltage source, on the other hand, the switch circuit switches to the second power source side and the current from the third current source flows into the second current source so that the current is inhibited from flowing into the second differential couple. As a result, the inputted differential signal is outputted only through the first differential couple. Accordingly, an equal gain is achieved over the entire range of the input operating voltage if the first and second differential couples are composed of transistors of the same polarity. Moreover, a high-speed switching operation is performed because the comparator and the switch circuit have a structure in which a current mirror circuit as provided in a conventional circuit is not provided so that a high-speed operation is performed.

In addition, the differential amplifier according to the present invention is provided with a voltage limit circuit performing the same operation as the comparator and the switch circuit in place thereof so that the gain is equal over the entire range of the input operating voltage and a high-speed operation is performed.

BEST MODES FOR CARRYING OUT THE INVENTION

Figure 1:
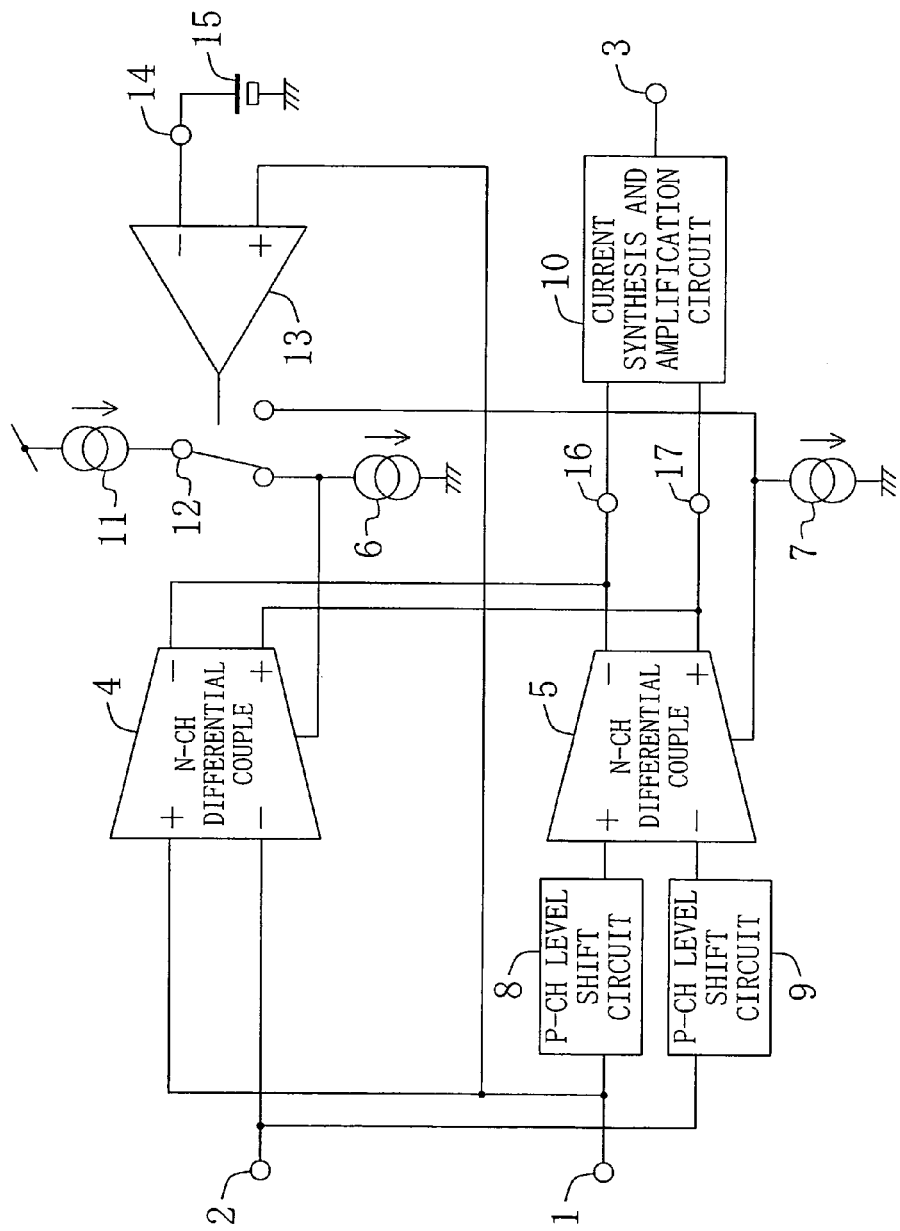
FIG. 1 is a view showing a block structure of an operational amplifier according to a first embodiment of the present invention.

Referring to the drawings, the embodiment of the present invention will be described herein below.

Embodiment 1

FIG. 1 shows a block diagram of an operational amplifier in the first embodiment.

Figure 2:
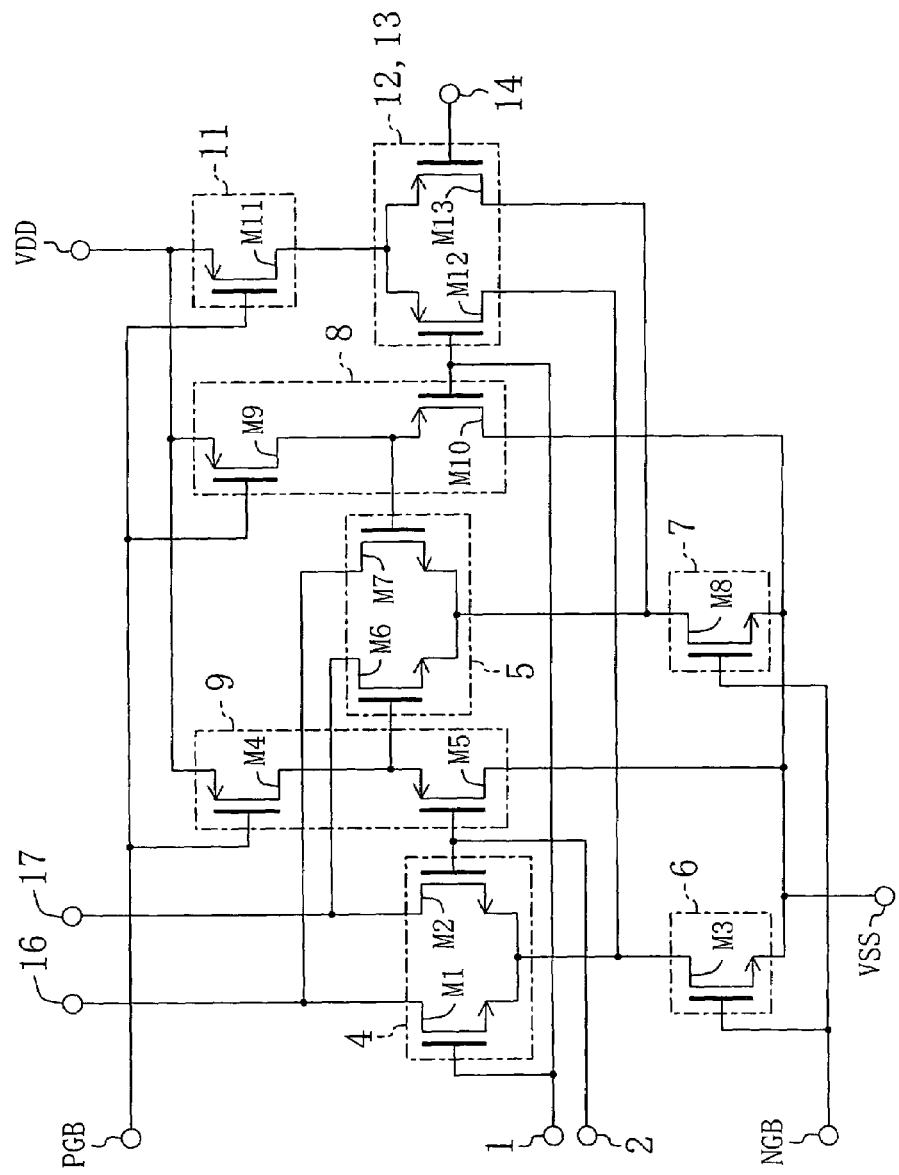
FIG. 2 is a view showing a specific circuit structure of a differential amplifier in the operational amplifier.

In FIGS. 1, 1 and 2 are first and second input terminals to which a differential signal composed of first and second signals is inputted. Respective voltage levels of the first and second signals inputted to the input terminals 1 and 2 are shifted by first and second level shift circuits 8 and 9 composed of p-channel MOS transistors. 5 is a first differential couple composed of n-channel MOS transistors. 4 is a second differential couple composed of n-channel MOS transistors having the same polarity as the first differential couple 5. 7 is a first current source for the first differential couple 5. 6 is a second current source for the second differential couple 4, which supplies a current equal in amount to a current supplied by the first current source 7. The first differential couple 5 and the first current source 7 convert the differential signal level-shifted by the first and second level shift circuits 8 and 9 to currents, while the second differential couple 4 and the second current source 6 convert the differential signal inputted to the first and second input terminals 1 and 2 to currents.

Figure 16:
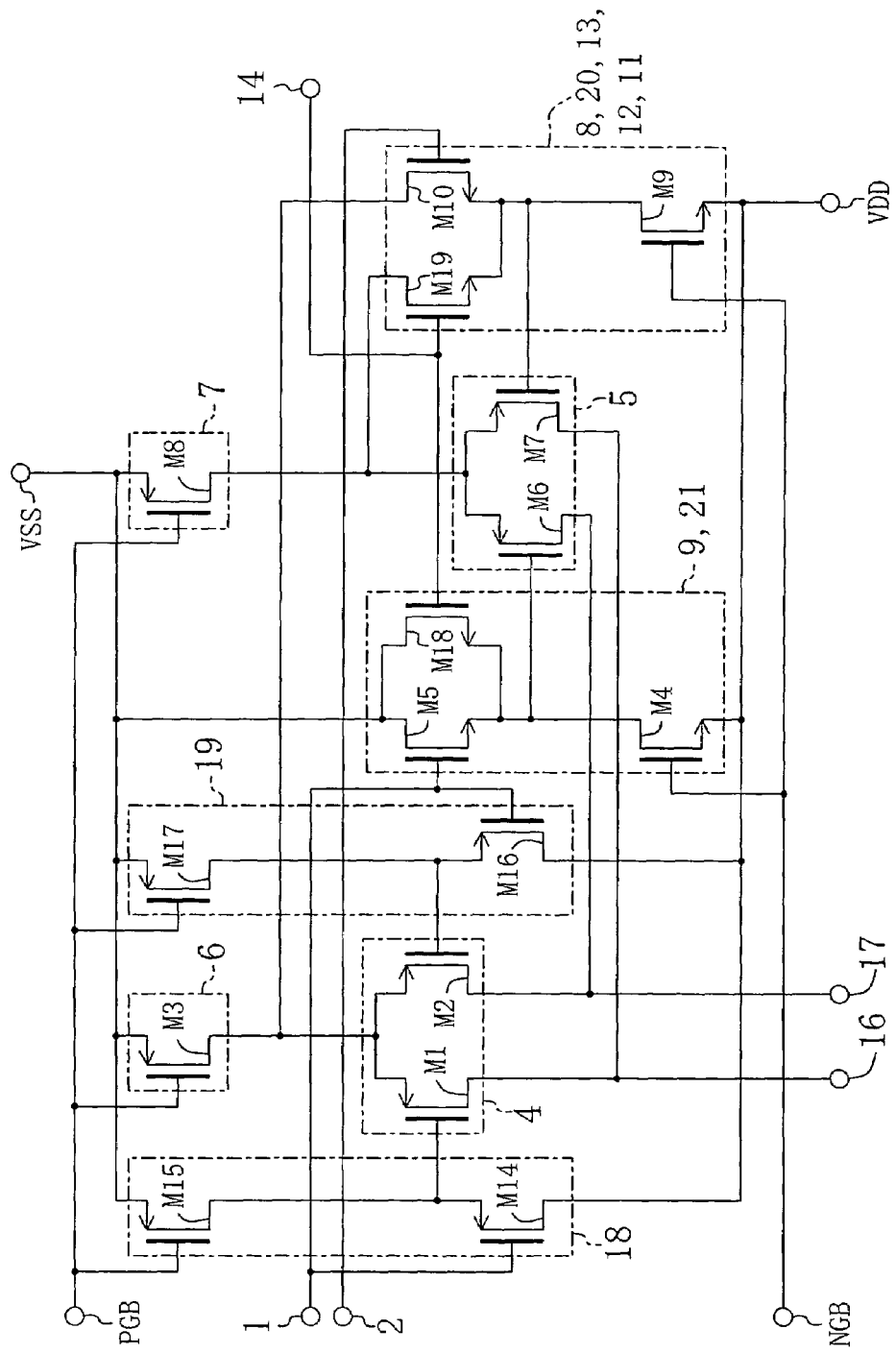
FIG. 16 is a view showing a specific circuit structure of a differential amplifier in the operational amplifier.
Figure 17:
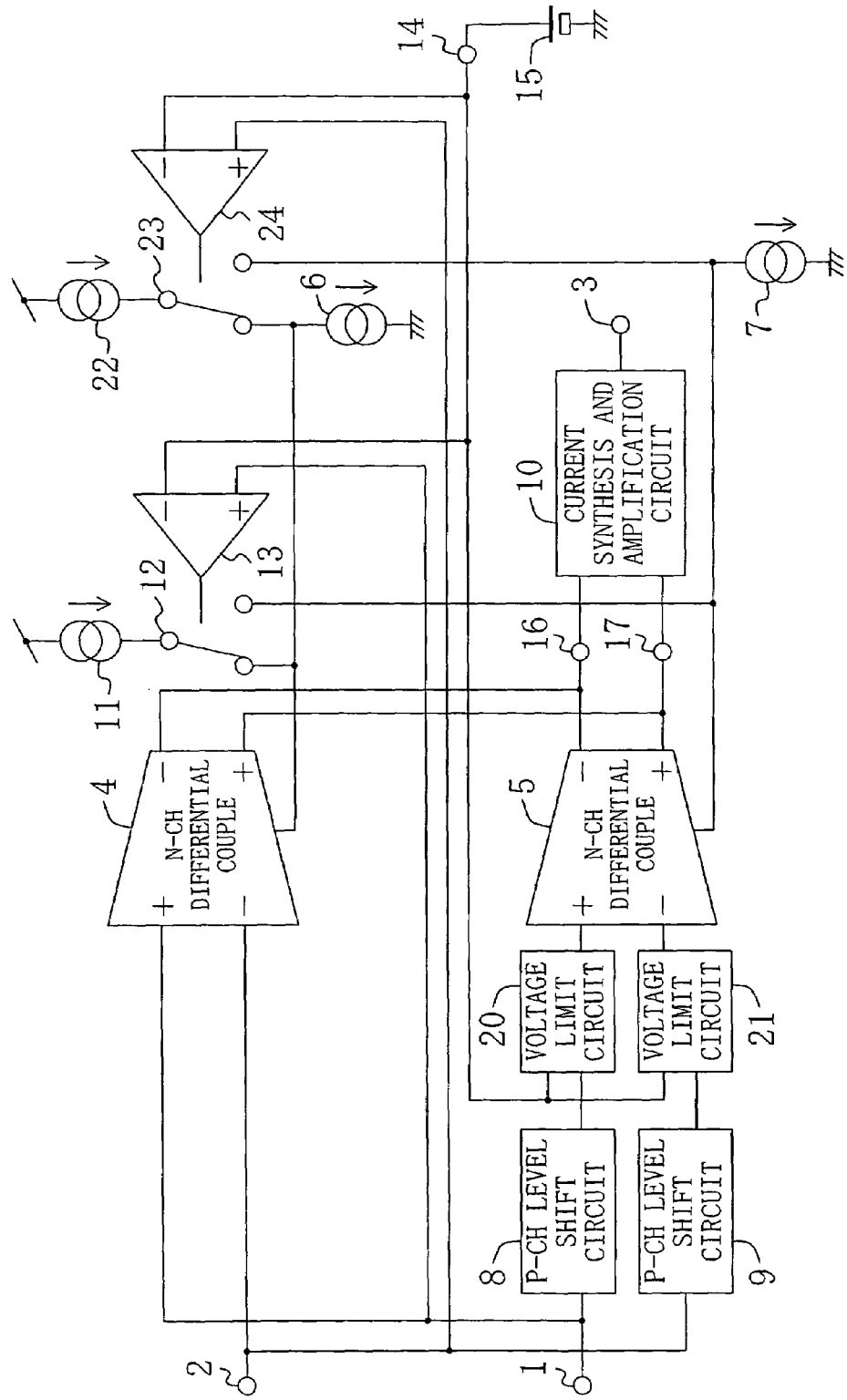
FIG. 17 is a view showing a block structure of an operational amplifier according to a fifth embodiment of the present invention.

In addition, 11 is a third current source for supplying a current equal in amount to each of the currents supplied by the first and second current sources 7 and 6, 12 is a switch circuit for selectively supplying the current from the third current source 11 to the first or second current source 7 or 6, 13 is a comparator for causing the switching operation of the switch circuit 12, and 15 is a reference voltage source having a given potential between a power source voltage VDD and a ground potential VSS. The reference voltage source 15 is connected to the minus terminal of the comparator 13 via an input terminal 14 to provide the comparator 13 with a criterion for judgment. A first signal (one of the two signals composing the differential signal) inputted to the first input terminal 1 is inputted to the plus terminal of the comparator 13. The comparator 13 switches the switch circuit 12 to the second current source 6 when the voltage of the first signal is less than the voltage of the reference voltage source 15. When the voltage of the first signal is not less than the voltage of the reference voltage source 15, the comparator 13 controls the switch circuit 12 such that it is switched to the first current source 7. In FIGS. 1, 16 and 17 are first and second output terminals to which the respective outputs of the first and second differential couples 5 and 4 are connected commonly. The foregoing components constitute the differential amplifier.

In FIG. 1, 10 is a current synthesis and amplification circuit for synthesizing and amplifying currents outputted from the output terminals 16 and 17 of the differential amplifier. The differential amplifier constitutes the operational amplifier in conjunction with the current synthesis and amplification circuit 10. In FIG. 1, 3 is an output terminal of the current synthesis and amplification circuit 10, which is also an output terminal of the operational amplifier.

FIG. 2 shows a specific circuit structure of the differential amplifier according to the present embodiment. In the drawing, two p-channel MOS transistors M9 and M10 compose the first level shift circuit 8 and other two p-channel MOS transistors M4 and M5 compose the second level shift circuit 9. On the other hand, two n-channel MOS transistors M6 and M7 compose the first differential couple 5 and other two n-channel MOS transistors M1 and M2 compose the second differential couple 4, while an n-channel MOS transistor M8 composes the first current source 7 and an n-channel MOS transistor M3 composes the second current source 6.

In FIG. 2, a p-channel MOS transistor (first transistor) M12 and another p-channel MOS transistor (second transistor) M13 compose the comparator 13 and the switch circuit 12, respectively. A p-channel MOS transistor M11 composes the third current source 11. In the comparator 13 and the switch circuit 12, a first signal from the first input terminal 1 is inputted to the gate of the p-channel MOS transistor M12 and the reference voltage source 15 (not shown in FIG. 2) is connected to the gate of the other p-channel MOS transistor M12 via the input terminal 14. The respective sources (one terminals) of the two p-channel MOS transistors M12 and M13 are connected commonly to the drain of the p-channel MOS transistor M11 of the third current source 11 and the drain (the other terminal) of the p-channel MOS transistor M12 is connected to the second current source 6, while the drain (the other terminal) of the other p-channel MOS transistor M13 is connected to the first current source 7.

Referring to FIGS. 1 and 2, the operation of the differential amplifier according to the present embodiment thus constructed will be described herein below.

In FIG. 1, when the voltage of the first signal from the input terminal 1 is in the vicinity of the ground potential VSS and less than the voltage of the reference voltage source 15, the current from the third current source 11 flows into the second current source 6 under the control of the comparator 13 and the switch circuit 12. As a result, the current from the second current source 6 is cancelled out by the current from the third current source 11 so that a current does not flow in the second differential couple 4. In this case, the inputted differential signal passes through the level shift circuits 8 and 9, the first differential couple 5, and the current synthesis and amplification circuit 10 to be amplified and outputted from the output terminal 3.

At this time, if the conductance of each of the n-channel transistors composing the first and second differential couples 5 and 4 is assumed to be gmn, the conversion rate gm of the differential amplifier is expressed as:

$$gm = gmn$$

in the vicinity of the ground potential VSS. The foregoing operation is sustained until the voltage of the first signal at the input terminal 1 exceeds the voltage of the reference voltage source 15.

When the first voltage at the input terminal 1 exceeds the voltage of the reference voltage source 15, the operation of each of the comparator 13 and the switch circuit 12 is inverted so that the current from the third current source 11 flows into the first current source 7. As a result, the current from the first current source 7 is cancelled out by the current from the third current source 11 so that a current does not flow in the first differential couple 5. In this case, the inputted differential signal passes through the first differential couple 4 and the current synthesis and amplification circuit 10 to be amplified and outputted from the output terminal 3.

At this time, the conversion rate gm of the differential amplifier becomes:

$$gm = gmn$$

and the operation can be sustained even in the vicinity of the power source voltage VDD. Thus, the voltage of the first signal has an equal gain over the entire range of the input operating voltage from the ground potential VSS to the power source voltage VDD.

In addition, the operational amplifier can operate at a high speed because the comparator 13 is capable of a high-speed switching operation unlike a current mirror circuit provided conventionally.

The operation of the differential amplifier according to the present embodiment will be described in greater detail with reference to FIG. 2. When the voltage of the first signal at the input terminal 1 is in the vicinity of the ground potential VSS, the p-channel MOS transistor M12 is turned ON so that the current in the p-channel MOS transistor M11 flows into the n-channel MOS transistor M3. As a result, the current in the n-channel MOS transistor M3 is cancelled out by the current in the p-channel MOS transistor M11 so that a current does not flow in the n-channel transistors M1 and M2. Consequently, the inputted differential signal passes through the p-channel MOS transistors M5 and M10 and the n-channel MOS transistors M6 and M7 to be outputted as current outputs of the differential amplifier from the output terminals 16 and 17. At this time, the conversion rate gm of the differential amplifier becomes:

$$gm = gmn$$

in the vicinity of the VSS. The foregoing operation is sustained until the voltage of the first signal at the input terminal 1 exceeds the voltage of the reference voltage source 15.

When the voltage of the first signal at the input terminal 1 exceeds the voltage of the reference voltage source 15, the p-channel MOS transistor M13 is then turned ON so that the current in the p-channel MOS transistor M11 flows into the n-channel MOS transistor M8. As a result, the current in the n-channel MOS transistor M8 is cancelled out by the current in the p-channel MOS transistor M11 so that a current does not flow in the n-channel transistors M6 and M7. Consequently, the inputted differential signal passes through the n-channel MOS transistors M1 and M2 to be outputted as the current outputs of the differential amplifier from the output terminals 16 and 17. At this time, the conversion rate gm of the differential amplifier becomes $$gm = gmn$$

and the operation can be performed even when the voltage of the first signal is in the vicinity of the power source voltage VDD.

As can be seen from FIG. 2, the comparator 13 and the switch circuit 12 do not have the structure of a current mirror circuit so that the p-channel MOS transistors M12 and M13 composing these components are capable of a high-speed switching operation and therefore the differential amplifier operates at a high speed.

In the differential amplifier of FIG. 2, the selection of the voltage of the reference voltage source 15 may be performed appropriately under such operating conditions that the p-channel MOS transistor M11 operates in a saturation region and the n-channel MOS transistor M3 operates in a saturation region when the n-channel MOS transistors M1 and M2 operate, while the n-channel MOS transistor M8 operates in a saturation region when the n-channel MOS transistors M6 and M7 operate. An amount of voltage level-shifted by the p-channel transistors M5 and M10 is determined by selectively and appropriately sizing the gate widths and gate lengths of the p-channel MOS transistors M5 and M10 and the n-channel MOS transistors M6 and M7 such that the n-channel MOS transistor M8 operates in saturation.

Although the present embodiment has inputted the first signal from the first input terminal 1 to the input terminal of the comparator 13, it is also possible to input the second signal from the second input terminal 2 to the input terminal of the comparator 13. The reason for this is that, when the differential amplifier according to the present embodiment is used for an operational amplifier, the voltage of the first signal at the first input terminal 1 becomes equal to the voltage of the second signal at the second input terminal 2 as a result of an imaginary short circuit in the operational amplifier and, even when either the voltage of the first signal or that of the second signal is used, it can be sensed through comparison.

Figure 3:
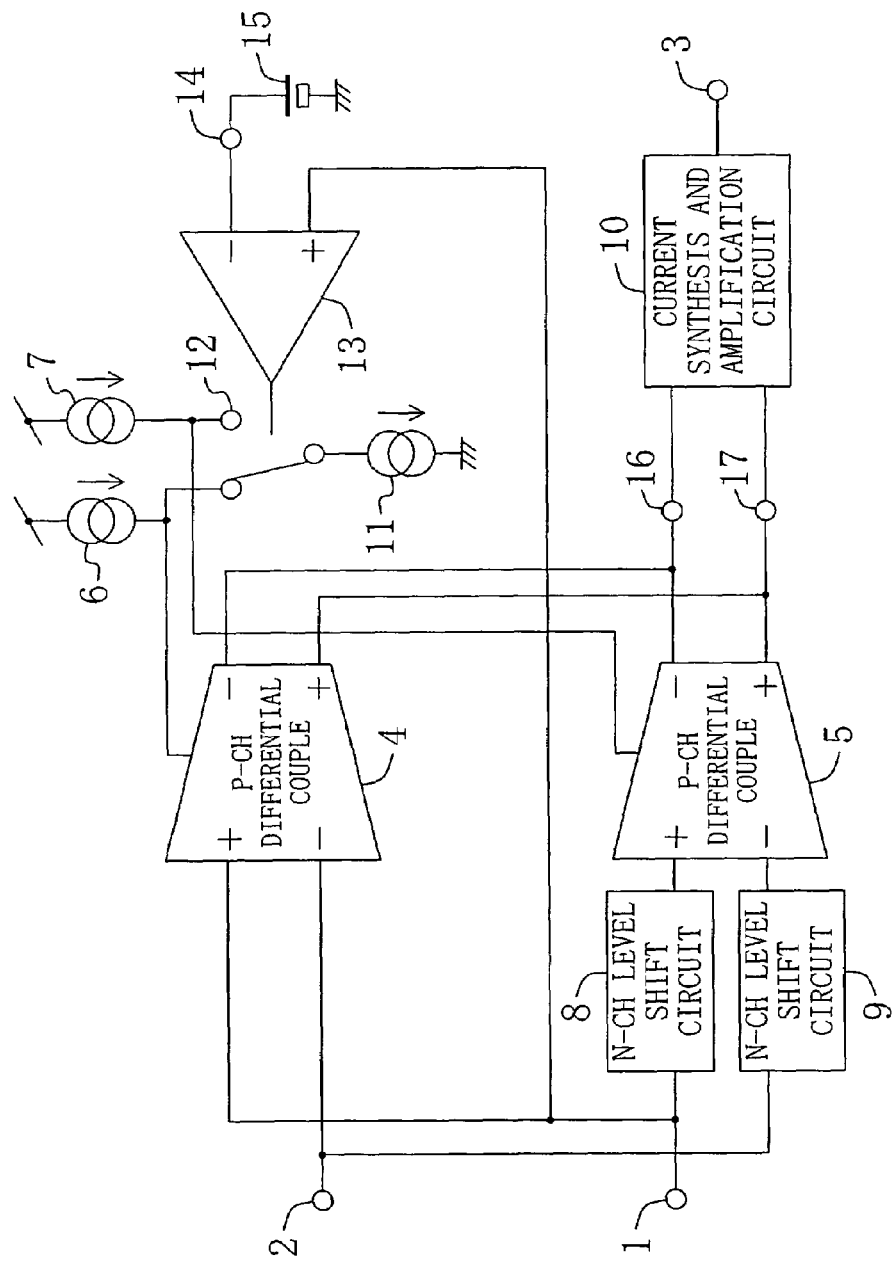
FIG. 3 is a view showing a block structure when the operational amplifier is composed of p-channel MOS transistors.
Figure 4:
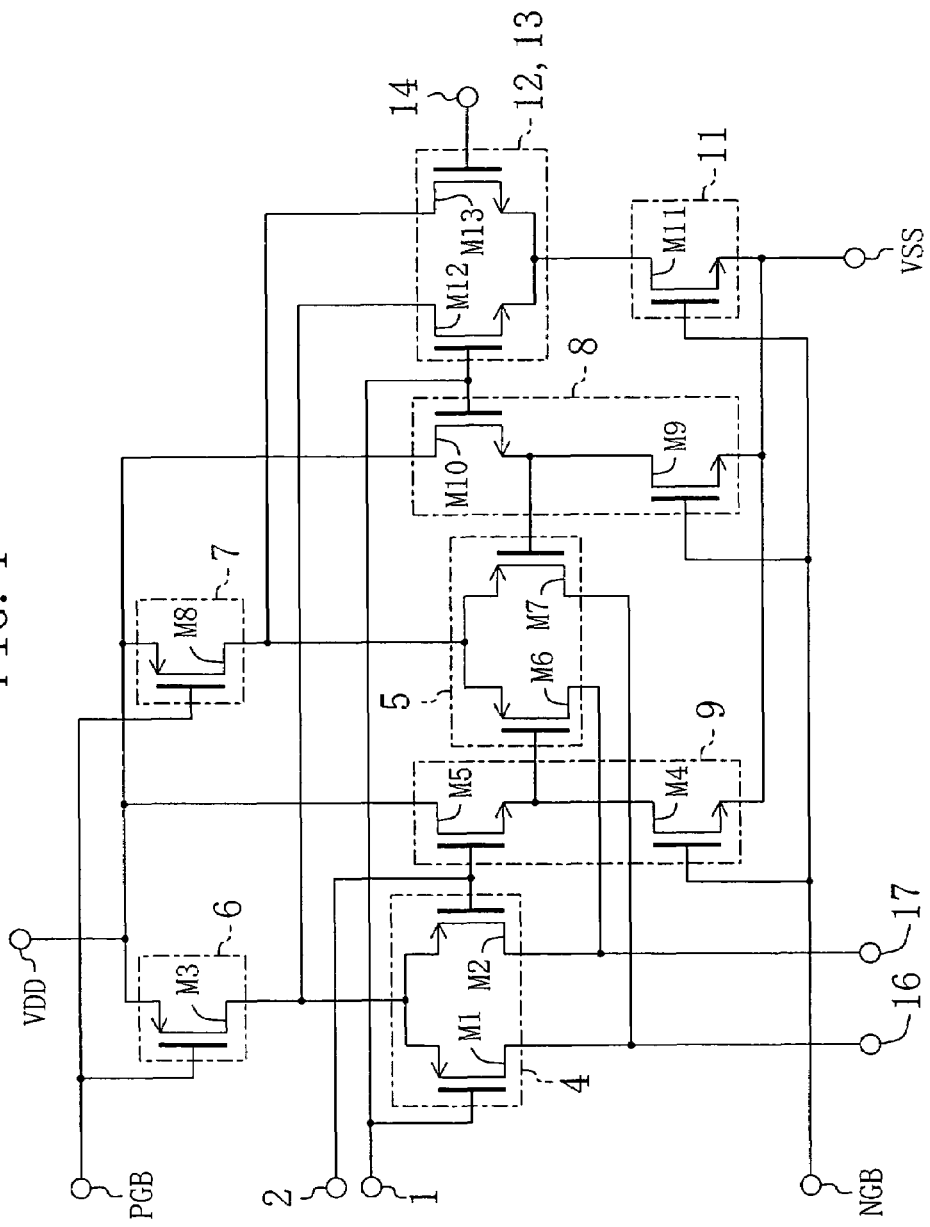
FIG. 4 is a view showing a specific circuit structure of a differential amplifier in the operational amplifier.

Although the present embodiment has constructed the differential amplifier by using the differential couples 4 and 5 composed of the n-channel MOS transistors, it will easily be appreciated that the differential amplifier may also be constructed by using differential couples composed of p-channel MOS transistors. A block diagram of an operational amplifier thus constructed is shown in FIG. 3 and a differential amplifier having a specific circuit structure thereof is shown in FIG. 4.

Embodiment 2

An operational amplifier according to the second embodiment will be described herein below.

Figure 5:
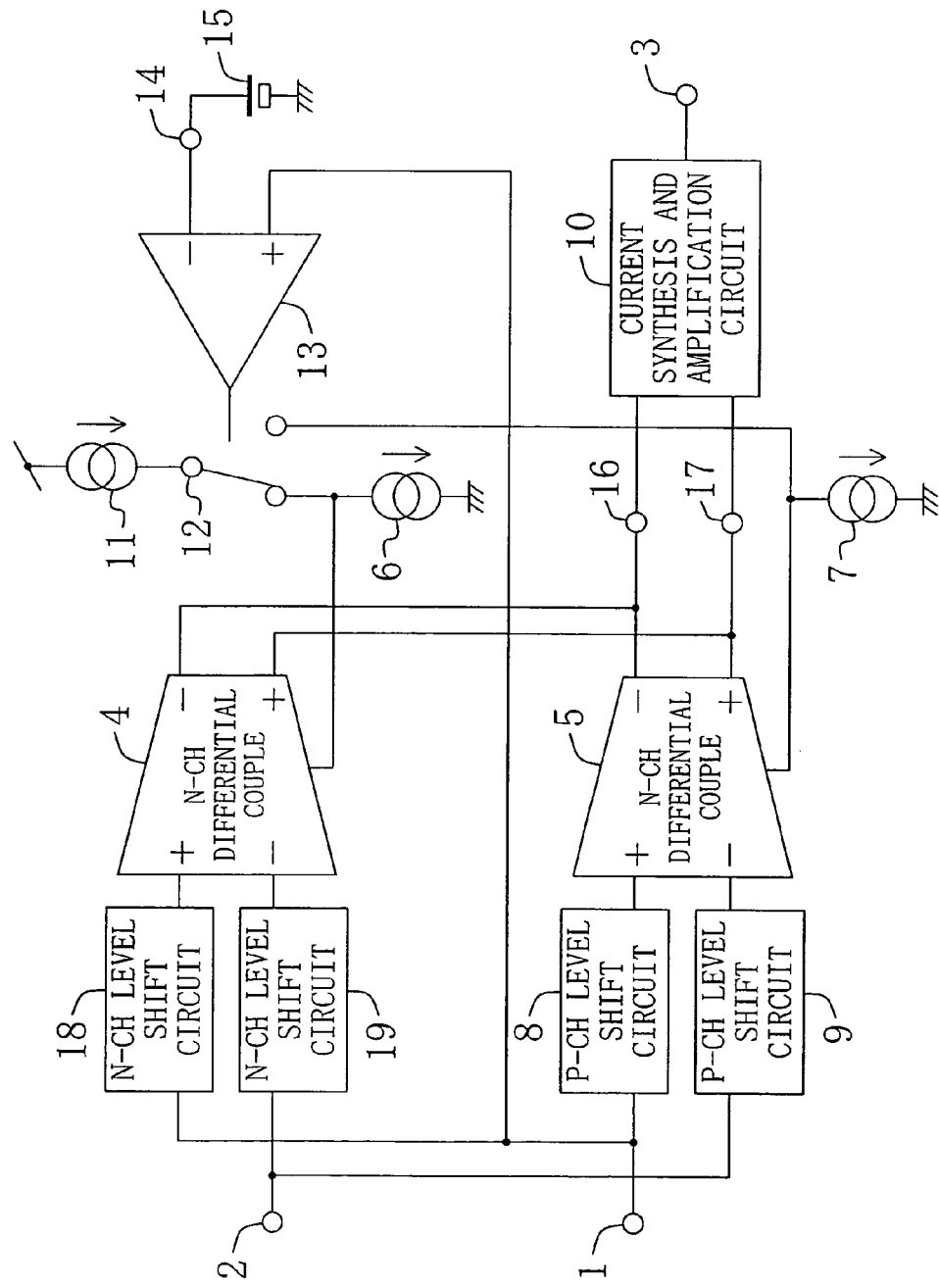
FIG. 5 is a view showing a block structure of an operational amplifier according to a second embodiment of the present invention.

FIG. 5 shows a block diagram of the operational amplifier according to the present embodiment. The operational amplifier in the drawing is obtained by disposing, in the structure of the operational amplifier shown in FIG. 1, additional third and fourth level shift circuits 18 and 19 composed of n-channel MOS transistors for shifting the voltage level of the differential signal at the first and second input terminals 1 and 2. The differential signal shifted in voltage level by the level shift circuits 18 and 19 is inputted to the second differential couple 4 and converted to currents.

Figure 6:
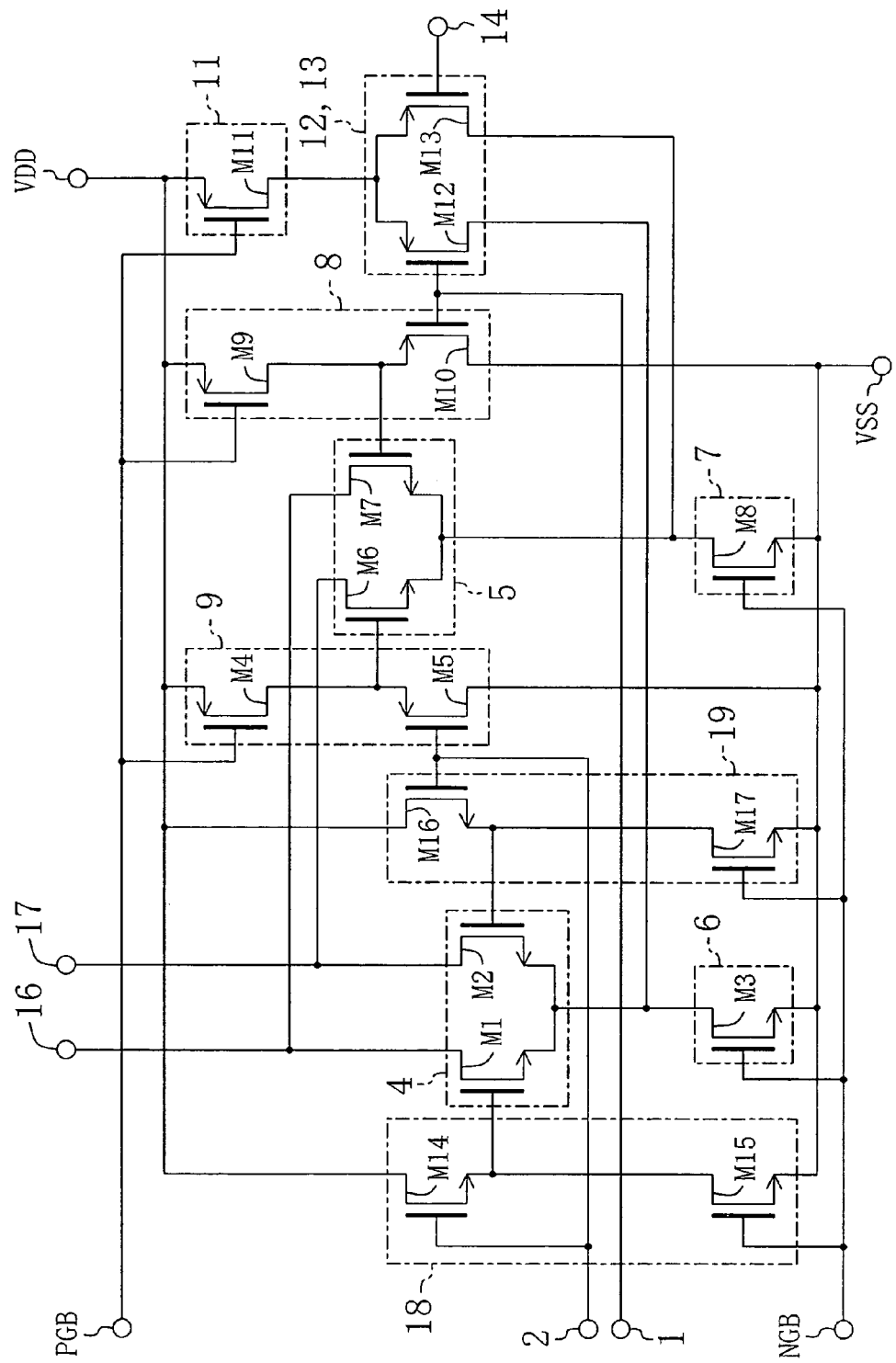
FIG. 6 is a view showing a specific circuit structure of a differential amplifier in the operational amplifier.

FIG. 6 shows a specific circuit diagram of the differential amplifier shown in FIG. 5. In the drawing, the third level shift circuit 18 is composed of two n-channel MOS transistors M14 and M15 and the fourth level shift circuit 19 is composed of other two n-channel MOS transistors M16 and M17.

In the operational amplifier according to the present embodiment, the differential signal is amplified through the first and second level shift circuits 8 and 9 and the first differential couple 5 when the voltage of the first signal at the input terminal 1 is less than the voltage of the reference voltage source 15, while the differential signal is amplified through the third and fourth level shift circuits 18 and 19 and the second differential couple 4 when the voltage of the first signal is not less than the voltage of the reference voltage source 15. It follows therefore that the differential signal passes through either one of the pair of level shifting circuits 8 and 9 and the pair of level shifting circuits 18 and 19 over the entire range of the input operating voltage. Consequently, a gain loss and the degradation of a frequency characteristic become equal over the entire range of the input operating voltage.

The operational amplifier of the present embodiment is the same as that of the first embodiment in that the gain is equal over the entire range of the input operating voltage and it performs a high-speed operation.

Figure 7:
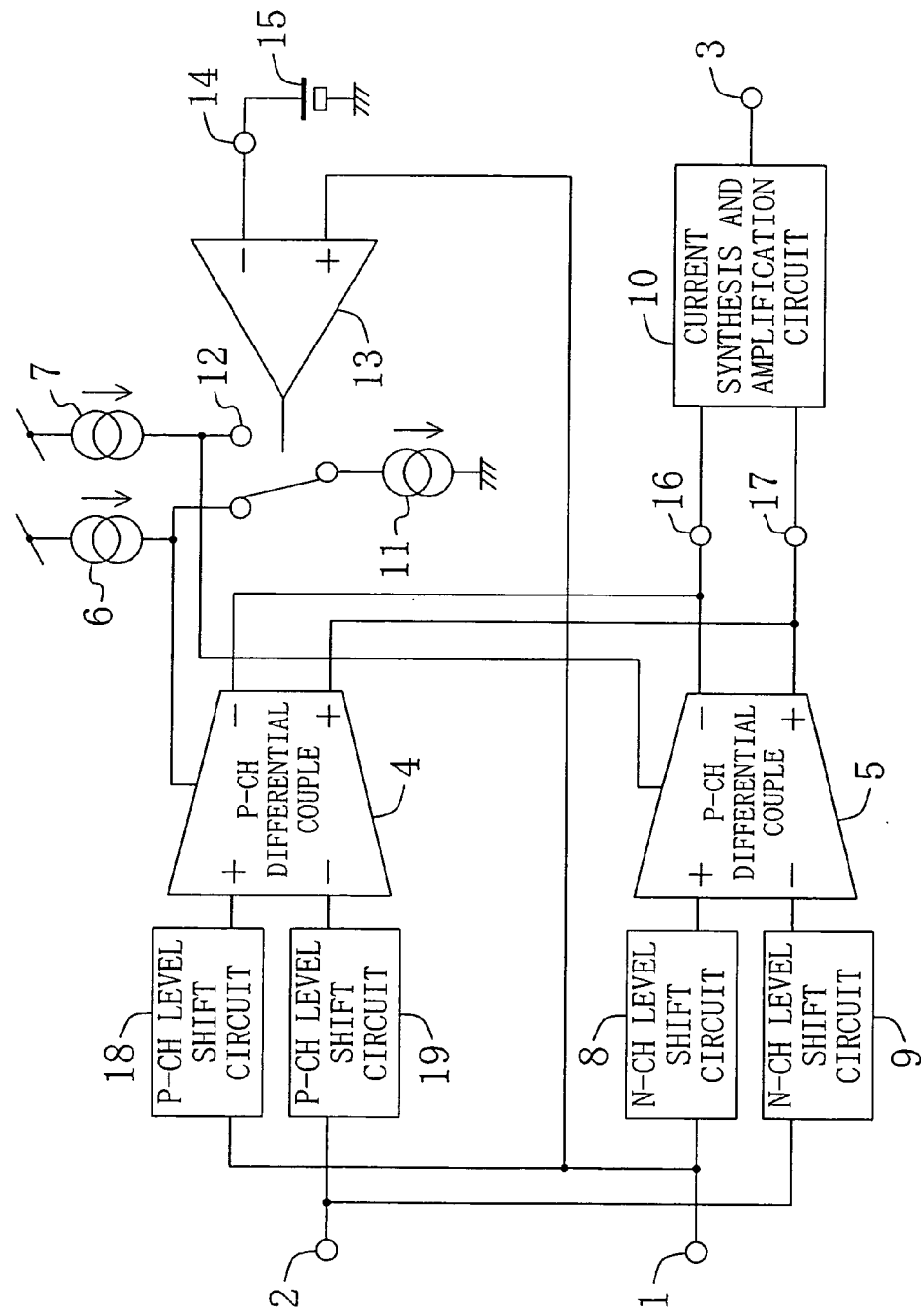
FIG. 7 is a view showing a block structure when the operational amplifier is composed of p-channel MOS transistors.
Figure 8:
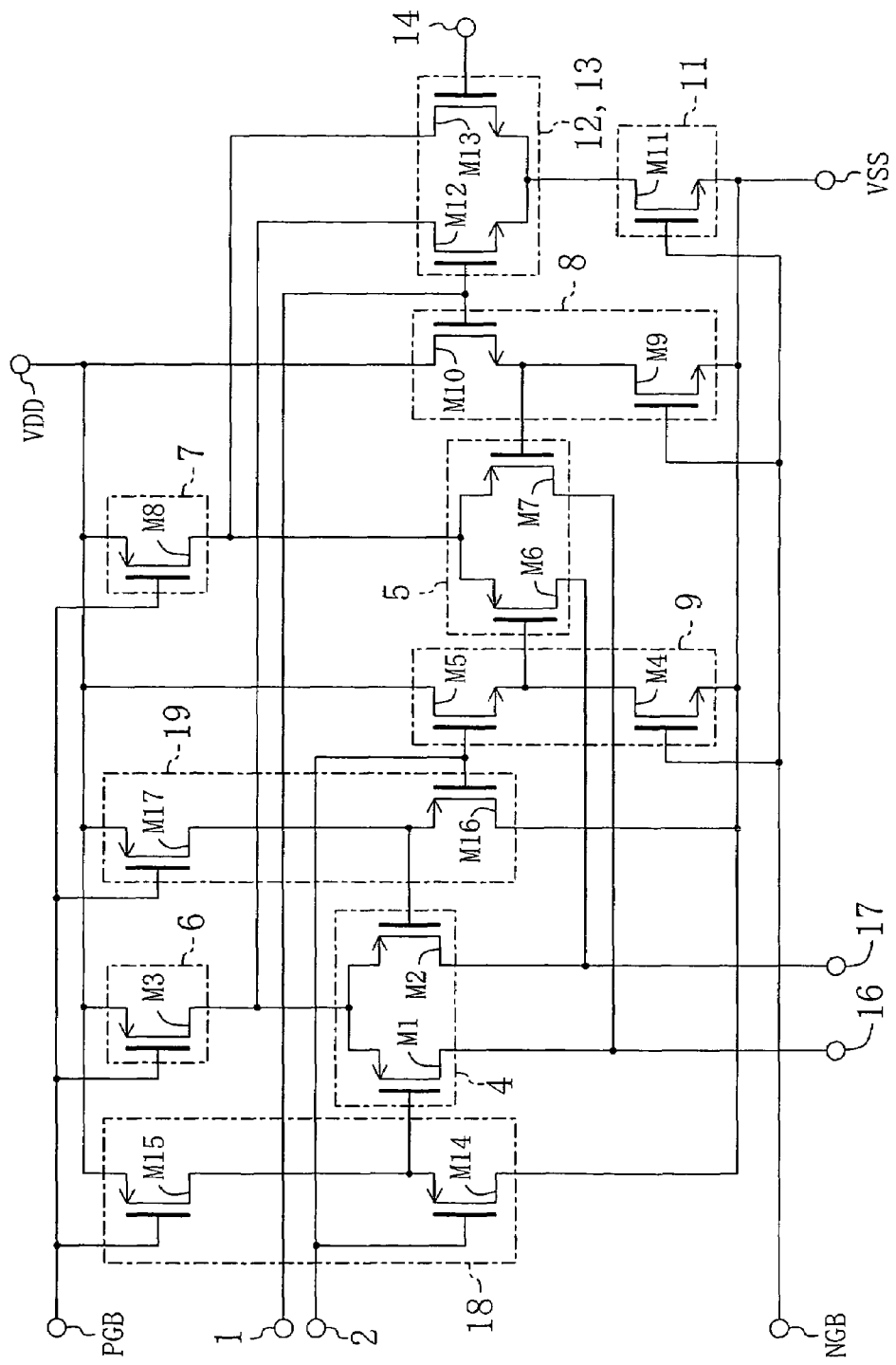
FIG. 8 is a view showing a specific circuit structure of a differential amplifier in the operational amplifier.

It will easily be appreciated that, in the present embodiment also, the second signal from the second input terminal 2 may be inputted to the input terminal of the comparator 13 and the circuit structure in which the differential couples 4 and 5 are composed of p-channel MOS transistors may be adopted. A block structure in which the differential couples 4 and 5 are composed of p-channel MOS transistors is shown in FIG. 7 and a specific circuit structure thereof is shown in FIG. 8.

Embodiment 3

A description will be given next to an operational amplifier according to the third embodiment of the present invention.

Figure 9:
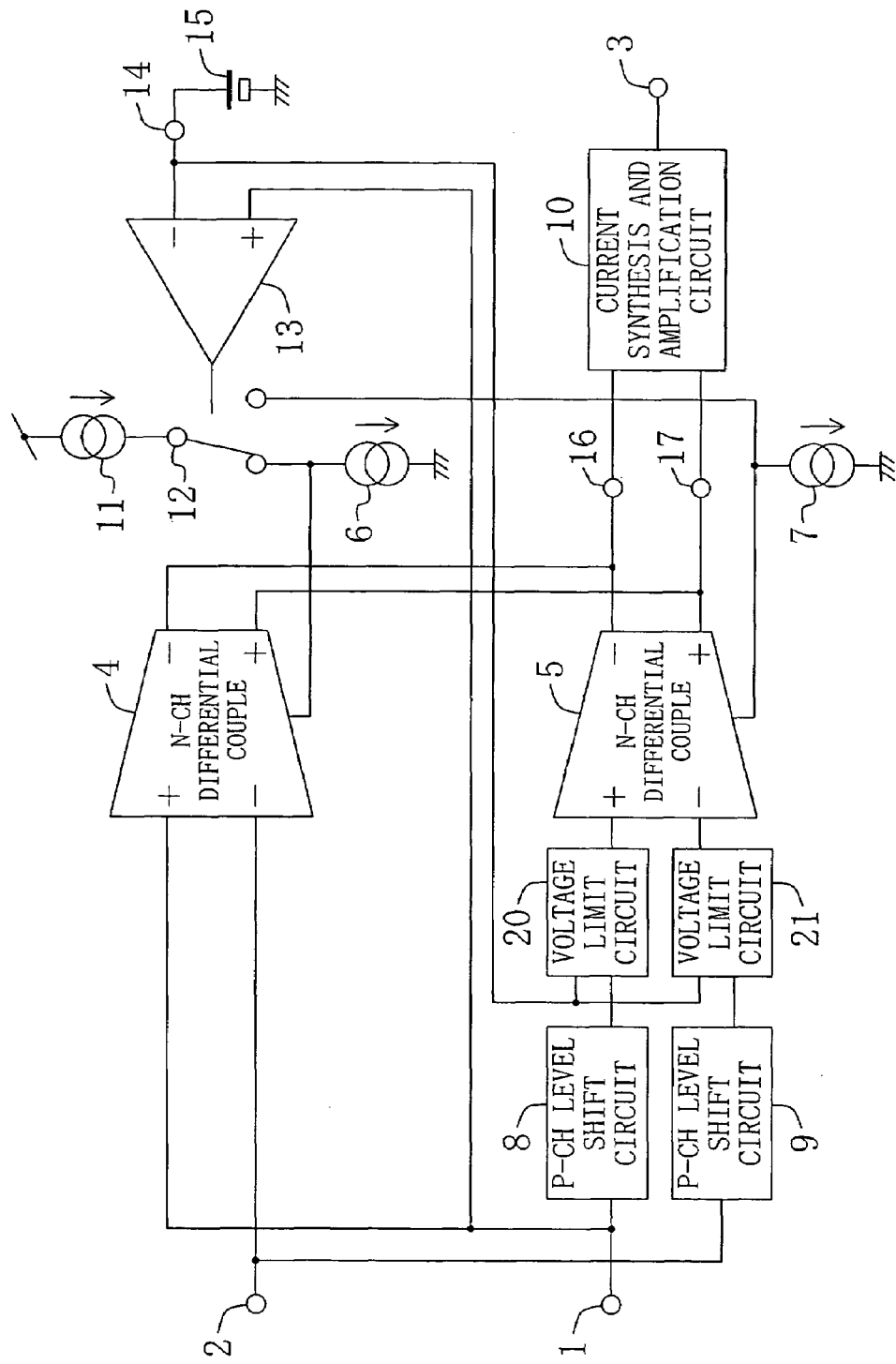
FIG. 9 is a view showing a block structure of an operational amplifier according to a third embodiment of the present invention.

FIG. 9 shows a block structure of the operational amplifier according to the present embodiment. The operational amplifier in the drawing is obtained by further adding first and second voltage limit circuits 20 and 21 to the structure of the operational amplifier shown in FIG. 1.

The first and second voltage limit circuits 20 and 21 are connected to the reference voltage source 15 to limit the voltage of the differential signal level-shifted by the first and second level shift circuits 8 and 9 to a value less than the voltage of the reference voltage source 15 and output the differential signal at the limited voltage to the first differential couple 5.

Figure 10:
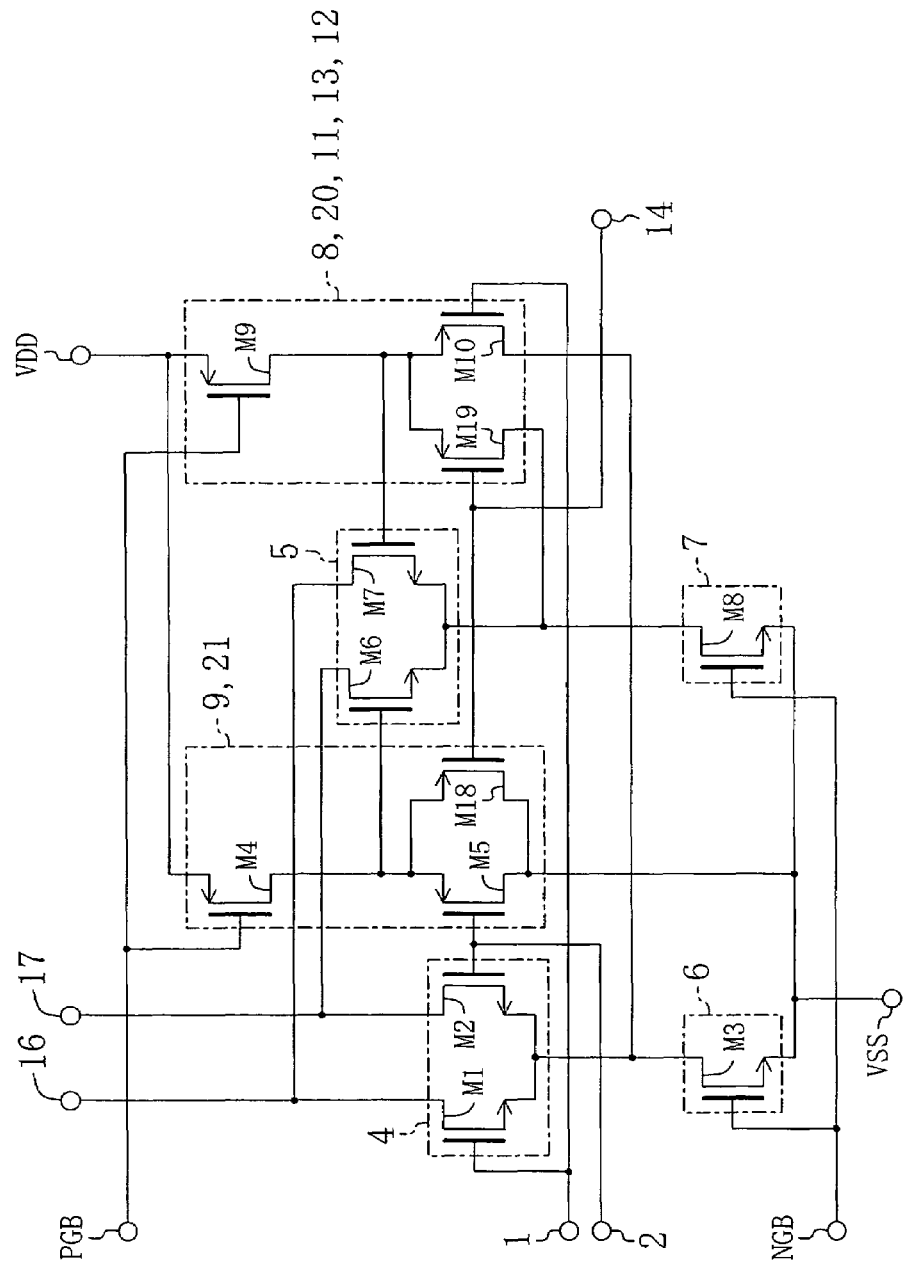
FIG. 10 is a view showing a specific circuit structure of a differential amplifier in the operational amplifier.

FIG. 10 shows a specific circuit structure of the differential amplifier according to the present embodiment. In the drawing, the first level shift circuit 8, the switch circuit 12, the comparator 3, the third current source 11, and the first voltage limit circuit 20 are composed of three p-channel MOS transistors M9, M10, and M11. On the other hand, the second level shift circuit 9 and the second voltage limit circuit 21 are composed of three p-channel MOS transistors M4, M5, and M18. In short, in the differential amplifier of FIG. 10, the p-channel MOS transistor M9 serves also as the p-channel MOS transistor M1 (the third current source 11) shown in FIG. 2 and the p-channel MOS transistors M10 and M19 serve also as the p-channel MOS transistors M12 and M13 (the switch circuit 12 and the comparator 13) shown in FIG. 2. Although the present embodiment has imparted the respective functions of the switch circuit 12 and the comparator 13 to the two p-channel MOS transistors M10 and M19 as described above, it will easily be appreciated that the respective functions of the switch circuit 12 and the comparator 13 may also be imparted to the two p-channel MOS transistors M5 and M18 instead.

In the present embodiment, therefore, the first current source 7 is selected by the comparator 13 and the switch circuit 12 particularly when the voltage of the first signal at the input terminal 1 is exceeding the voltage of the reference voltage source 15 so that the current from the first current source 7 is cancelled out by the current from the third current source 11 and a current does not flow in the first differential couple 5. As a result, the inputted differential signal is converted to currents by the first differential couple 4, while the voltage of the differential signal level-shifted by the first and second level shift circuits 8 and 9 is limited to the voltage of the reference voltage source 15 by the p-channel MOS transistors M18 and M19 composing the first and second voltage limit circuits 20 and 21. This surely prohibits the operation of the first differential couple 5 when the voltage of the first signal is exceeding the voltage of the reference voltage source 15.

Figure 11:
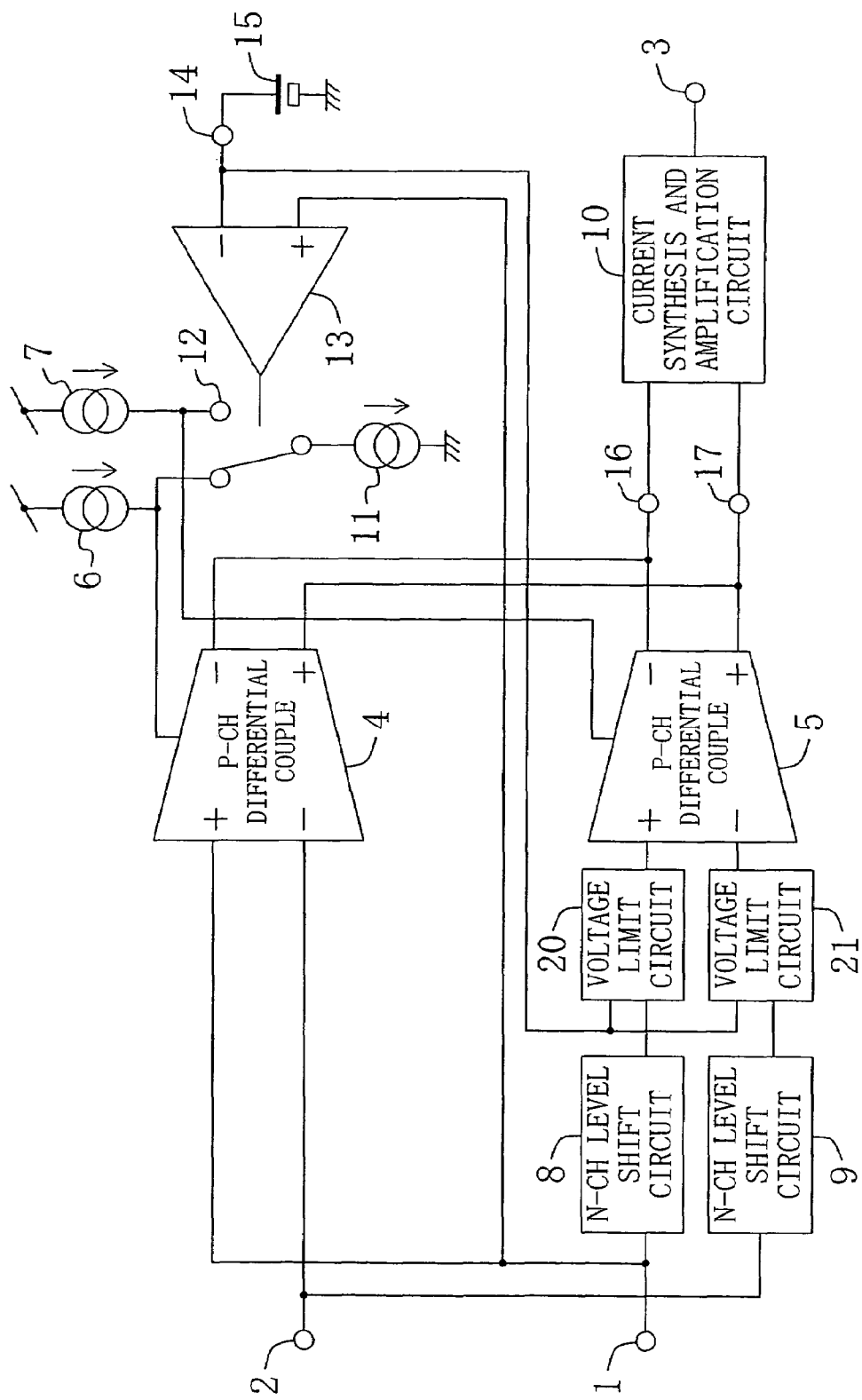
FIG. 11 is a view showing a block structure when the operational amplifier is composed of p-channel MOS transistors.
Figure 12:
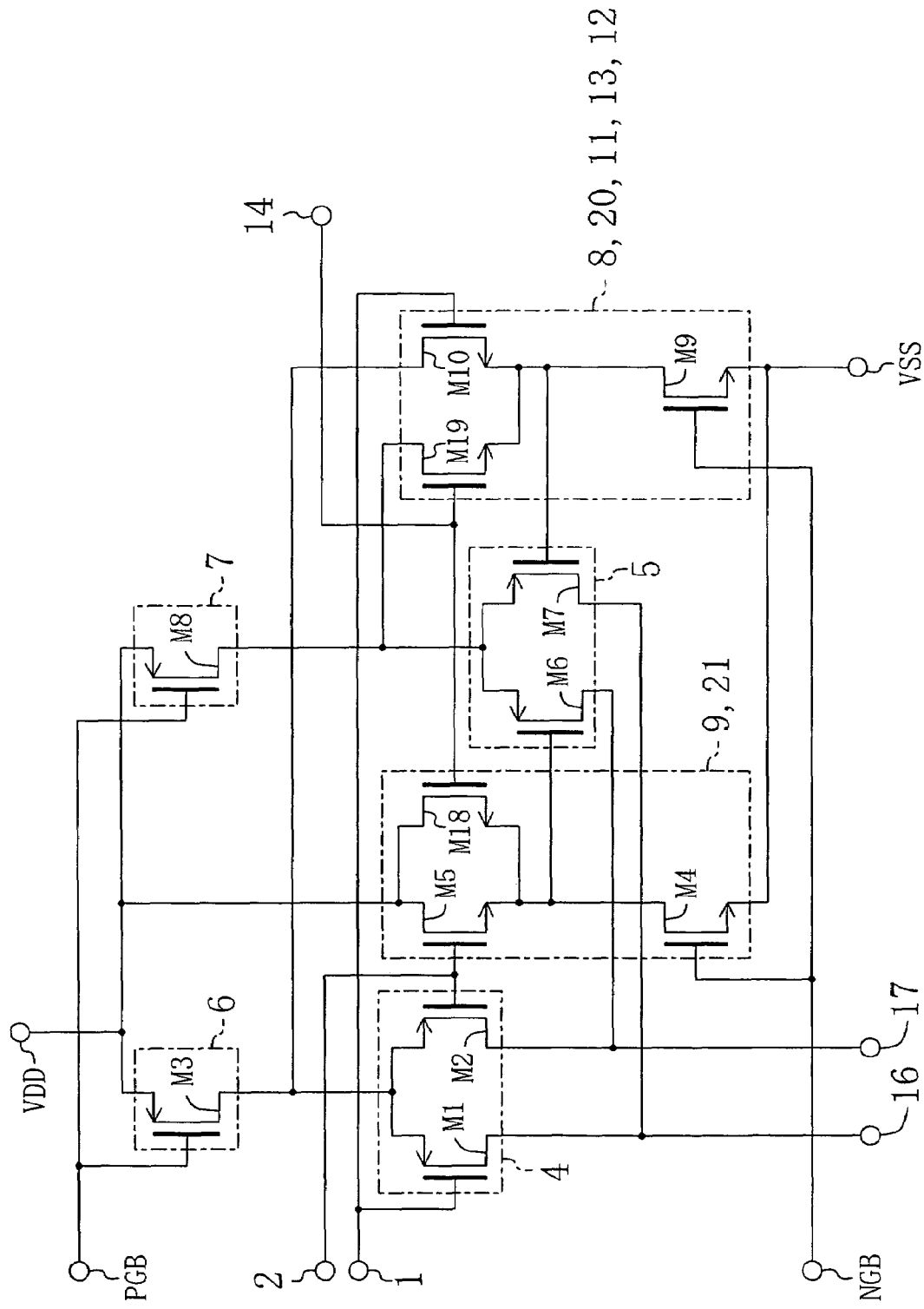
FIG. 12 is a view showing a specific circuit structure of a differential amplifier in the operational amplifier.

It will easily be appreciated that, in the present embodiment also, the second signal from the second input terminal 2 may be inputted appropriately to the input terminal of the comparator 13 and the circuit structure in which the differential couples 4 and 5 are composed of p-channel MOS transistors may be adopted appropriately. A block structure in which the differential couples 4 and 5 are composed of p-channel MOS transistors is shown in FIG. 11 and a specific circuit structure thereof is shown in FIG. 12.

Embodiment 4

A description will be given next to an operational amplifier according to the fourth embodiment of the present invention.

Figure 13:
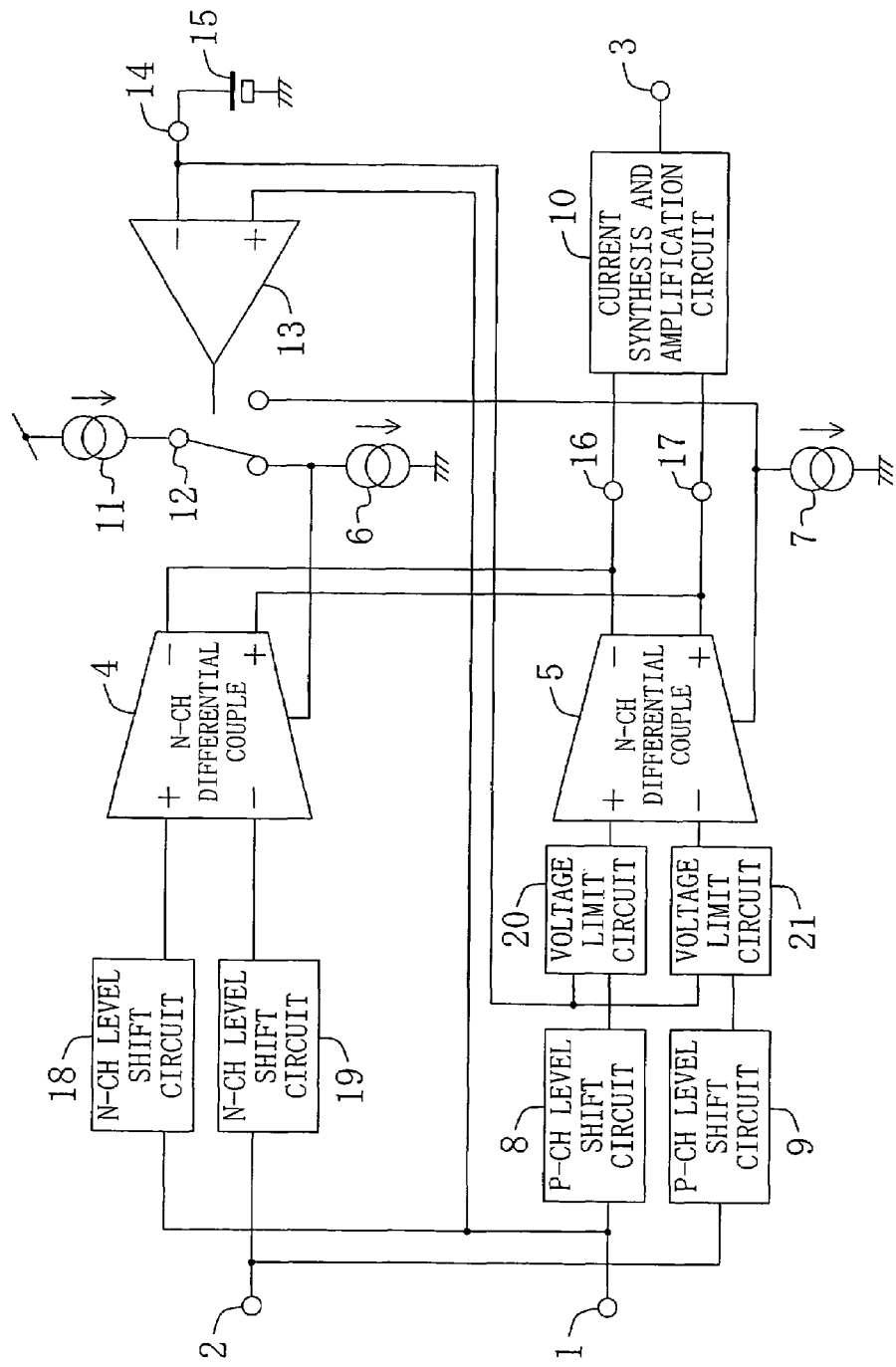
FIG. 13 is a view showing a block structure of an operational amplifier according to a fourth embodiment of the present invention.
Figure 14:
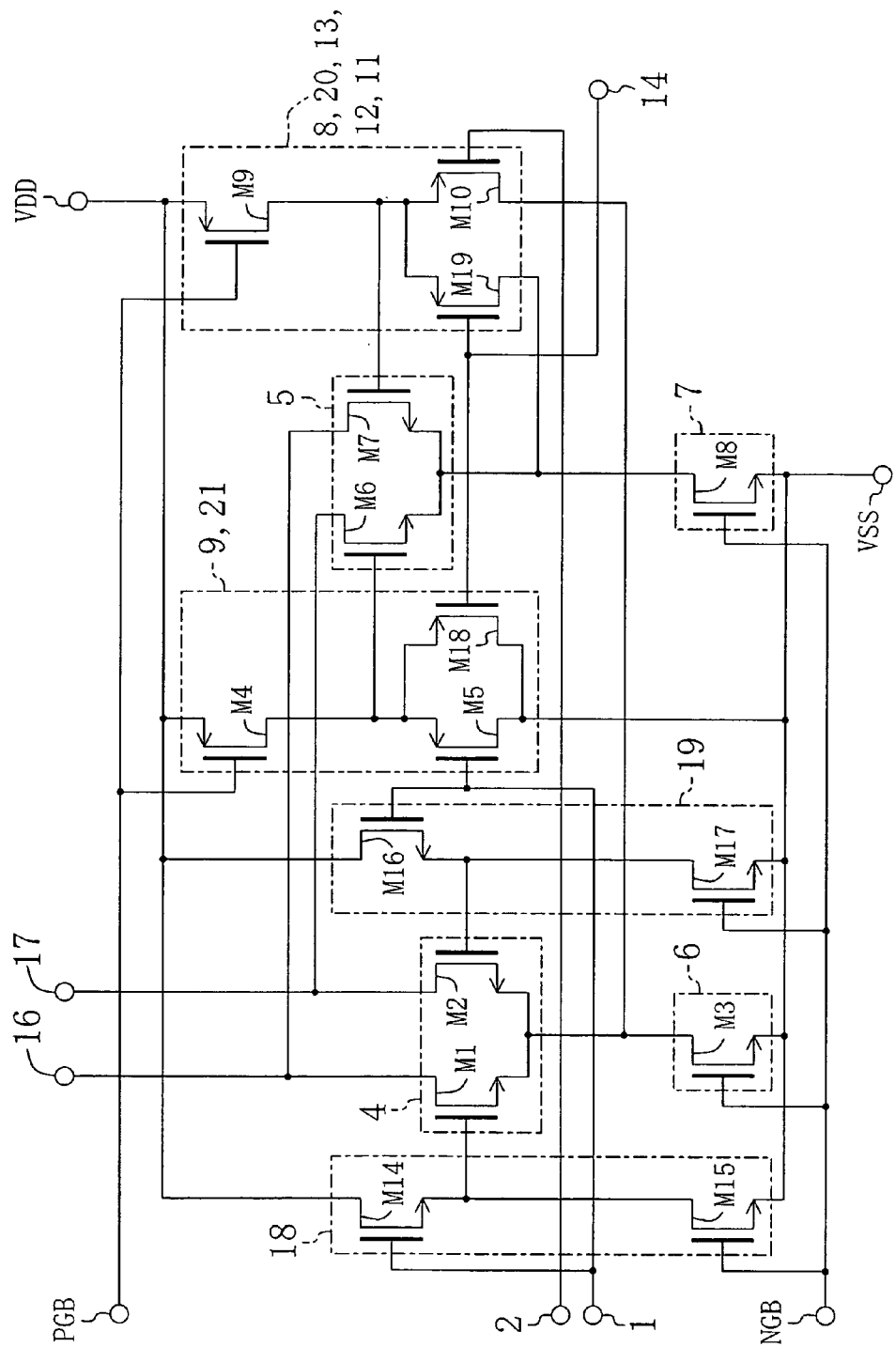
FIG. 14 is a view showing a specific circuit structure of a differential amplifier in the operational amplifier.

FIG. 13 shows an operational amplifier according to the present embodiment. Although the third embodiment has added the first and second voltage limit circuits 20 and 21 to the circuit structure of the operational amplifier according to the first embodiment shown in FIG. 1, the present embodiment adds the first and second voltage limit circuits 20 and 21 to the circuit structure of the operational amplifier according to the second embodiment shown in FIG. 5. As for the other structure, it is the same as in FIG. 5. FIG. 14 shows a specific circuit structure of the operational amplifier of FIG. 13.

Accordingly, the present embodiment allows the obtention of the differential amplifier having an equal gain over the entire range of the input operating voltage and operating at a high speed by enabling a high-speed switching operation by using the comparator 13 and the switch circuit 12, while achieving an equal gain loss and equal degradation of a frequency characteristic over the entire range of the input operating voltage by providing the two pairs of level shift circuits 8 and 9 and level shift circuits 18 and 19. In addition, the present embodiment can ensure a switching operation by prohibiting the operation of the first differential couple 5 when the voltage of the first signal is exceeding the voltage of the reference voltage source 15.

Figure 15:
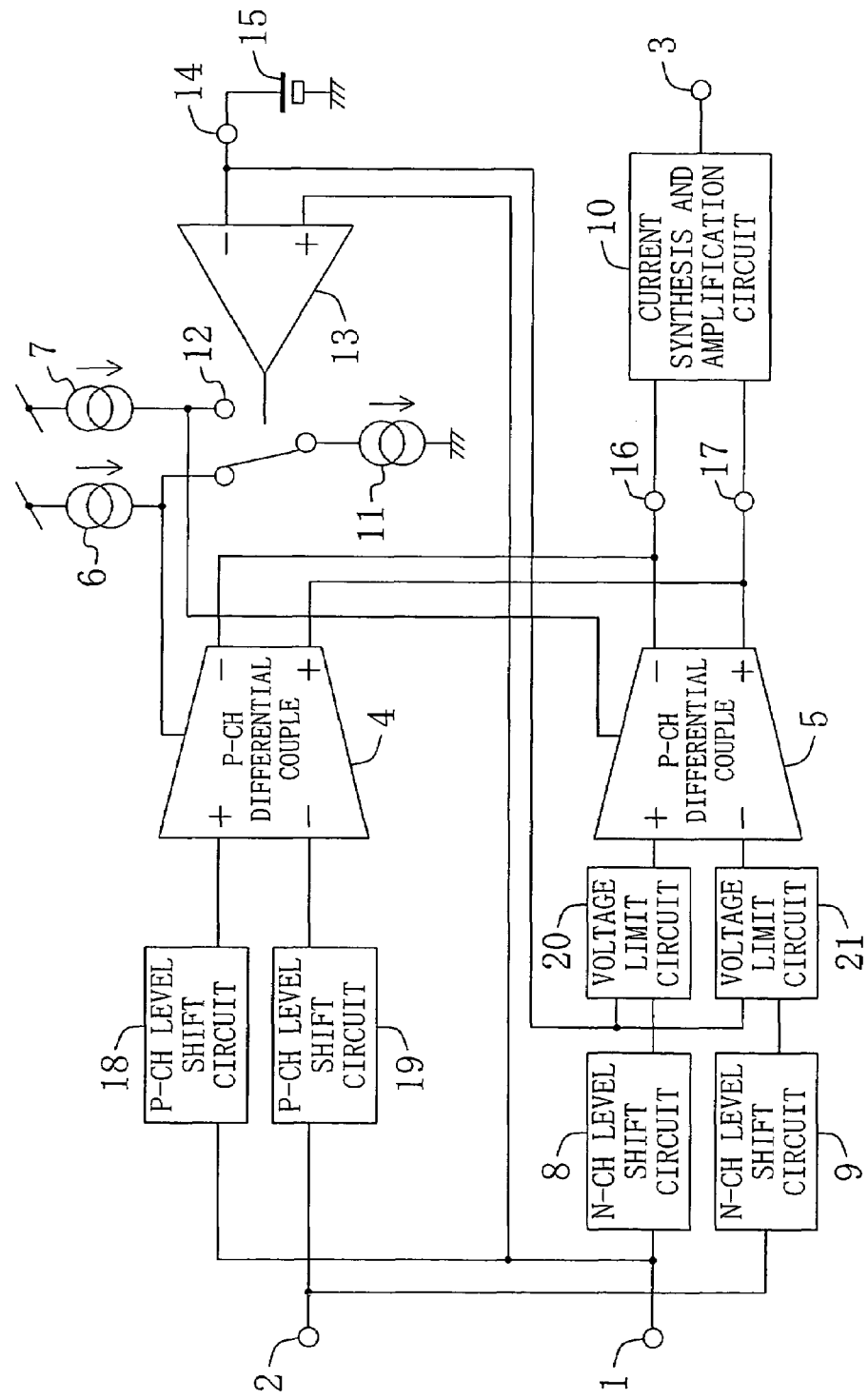
FIG. 15 is a view showing a block structure when the operational amplifier is composed of p-channel MOS transistors.

A block structure in which the differential couples 4 and 5 are composed of p-channel MOS transistors instead of n-channel MOS transistors as used in the present embodiment is shown in FIG. 15 and a specific circuit structure thereof is shown in FIG. 16.

Embodiment 5

A description will be given next to an operational amplifier according to the fifth embodiment of the present invention.

FIG. 17 shows a block structure of an operational amplifier according to the present embodiment. The operational amplifier shown in the drawing is obtained by further adding a fourth current source 22, a second switch circuit 23, and a second comparator 24 to the structure of the operational amplifier according to the third embodiment shown in FIG. 9. The second switch circuit 23 selectively supplies a current from the fourth current source 22 to the first current source 7 or to the second current source 6, similarly to the first switch circuit 11. On the other hand, the second comparator 24 causes the switching operation of the second switch circuit 23 and has a minus terminal to which the reference voltage source 15 is connected via the input terminal 14 and a plus terminal to which the second signal inputted to the second input terminal 2 is inputted, which is different from the first comparator 13 having the plus terminal to which the first signal from the first input terminal 1 is inputted.

Figure 18:
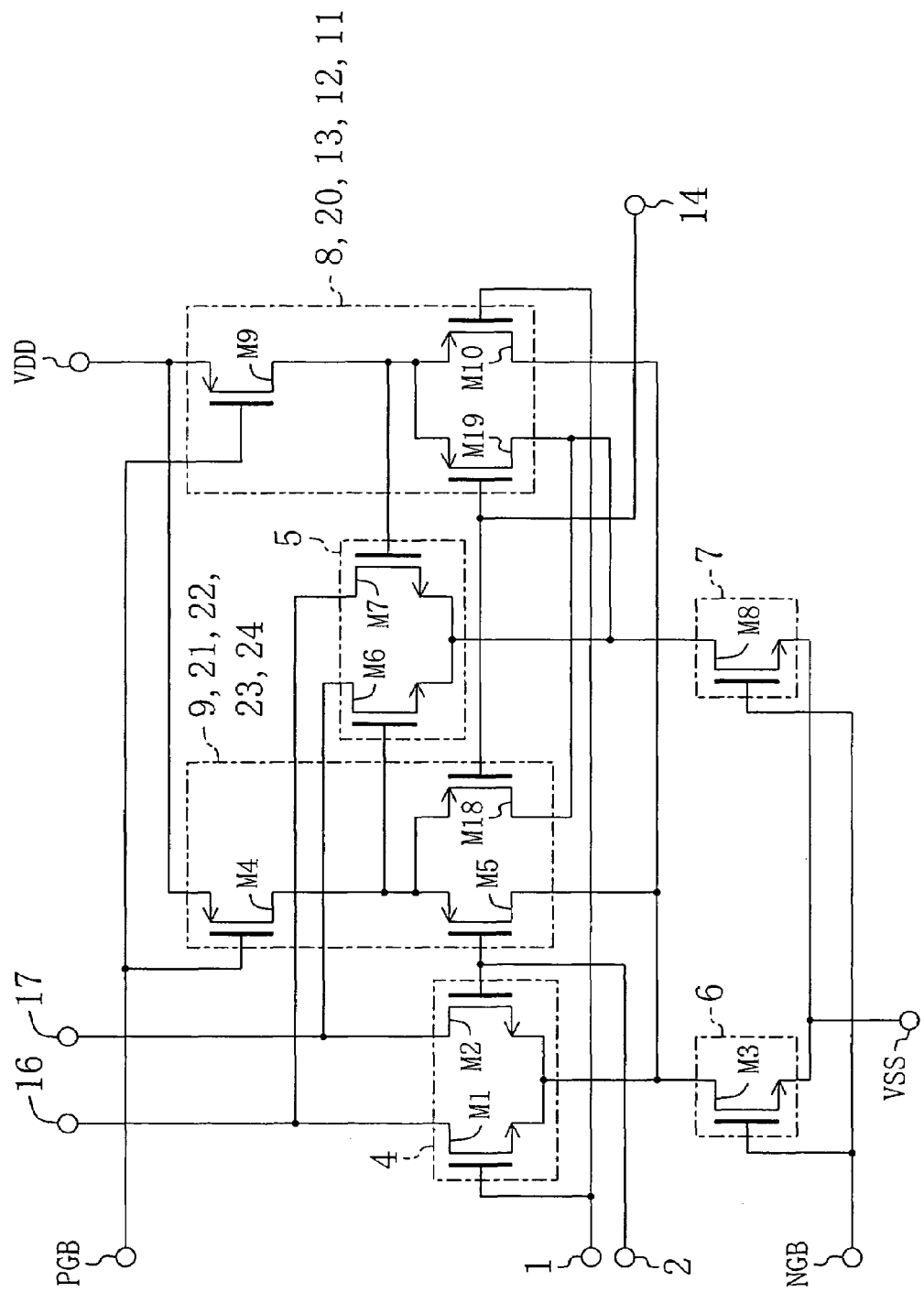
FIG. 18 is a view showing a specific circuit structure of a differential amplifier in the operational amplifier.

FIG. 18 shows a specific circuit structure of the differential amplifier according to the present embodiment. In the drawing, three p-channel MOS transistors M4, M5, and M18 compose the second level shift circuit 9, the second voltage limit circuit 21, the fourth current source 22, the second switch circuit 23, and the second comparator 24.

In the present embodiment, therefore, the currents from the third and fourth current sources 11 and 22 flow into the second current source 6 under the control of the first and second comparators 13 and 24 and the first and second switch circuits 12 and 23 particularly when the voltages of the first and second signals at the input terminals 1 and 2 are in the vicinity of the ground potential VSS so that the current from the second current source 6 is cancelled out by the currents from the third and fourth current sources 11 and 22 and a current does not flow in the second differential couple 4. As a result, the inputted differential signal is converted only by the first differential couple 5 to currents. By contrast, if the voltages of the first and second signals at the first and second input terminals 1 and 2 exceed the voltage of the reference voltage power source 15, the currents from the third and fourth current sources 11 and 22 flow into the first current source 7 under the control of the first and second comparators 13 and 24 and the switch circuits 12 and 23 so that the current from the first current source 7 is cancelled out and a current does not flow in the first differential couple 5. As a result, the inputted differential signal is converted only by the second differential couple 4 to currents. As for the other operations and effects, they are the same as in the operational amplifiers of FIGS. 1 and 9 so that the description thereof will be omitted.

Figure 19:
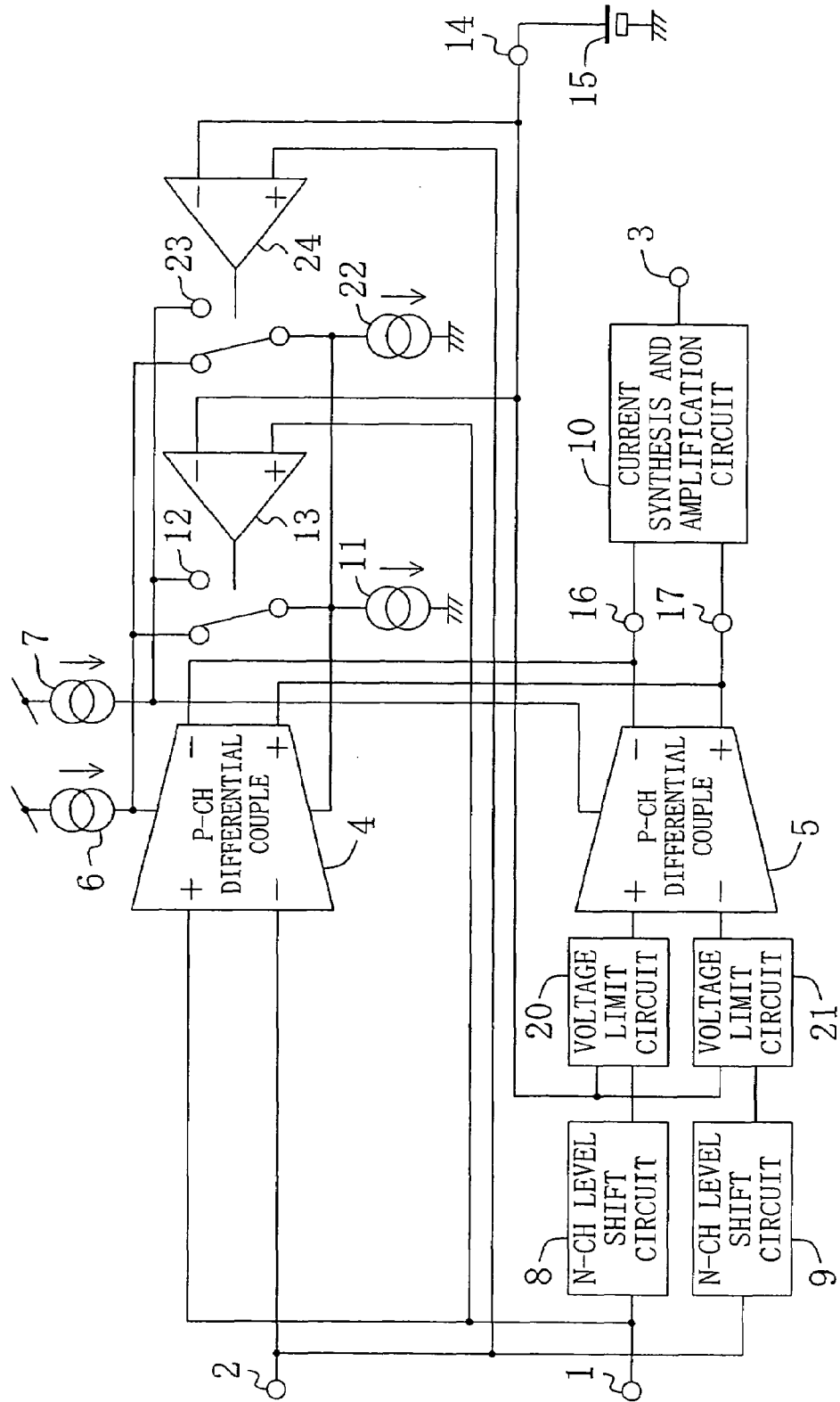
FIG. 19 is a view showing a block structure when the operational amplifier is composed of p-channel MOS transistors.
Figure 20:
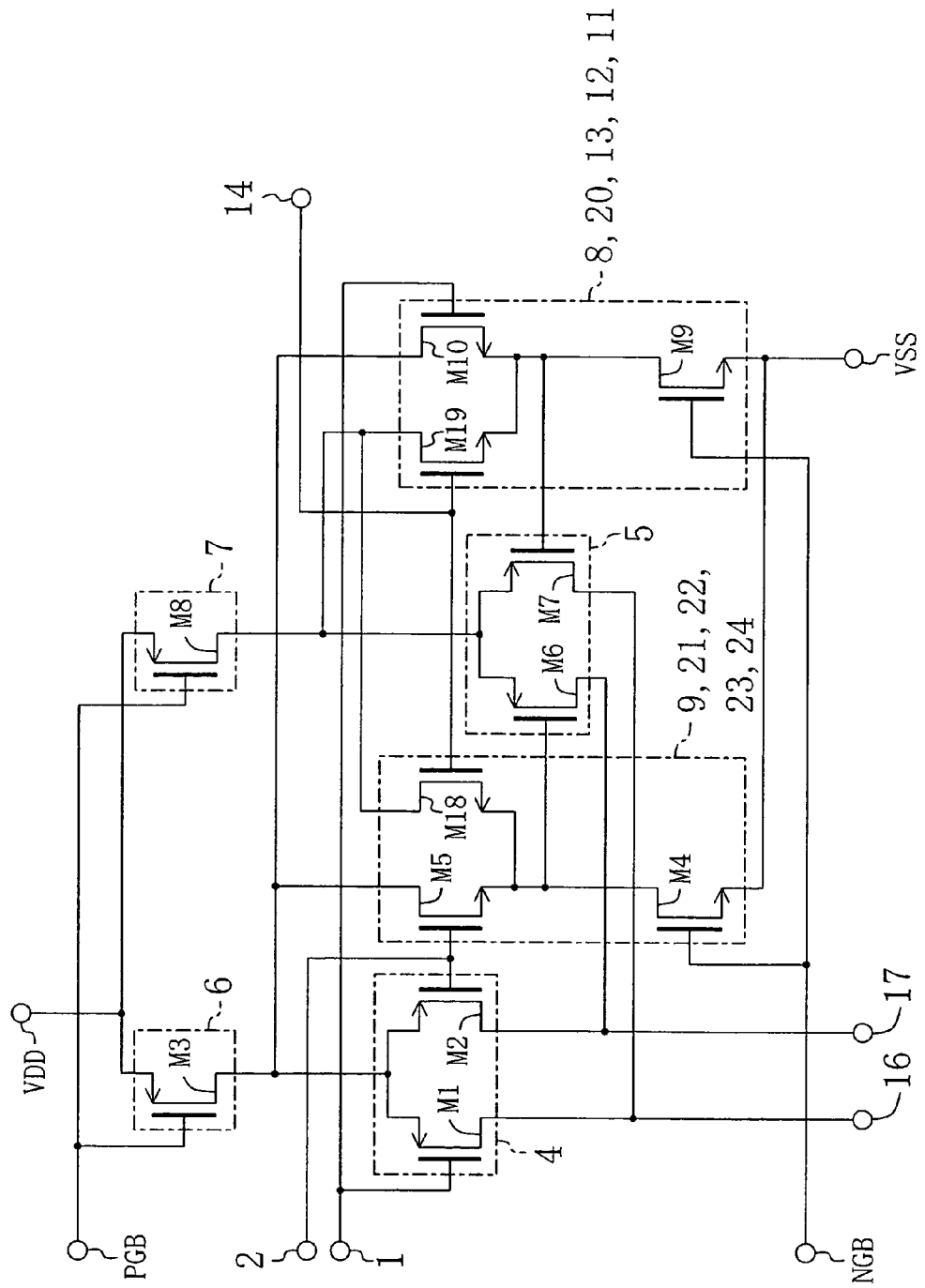
FIG. 20 is a view showing a specific circuit structure of a differential amplifier in the operational amplifier.

A block structure in which the differential couples 4 and 5 are composed of p-channel MOS transistors instead of n-channel MOS transistors as used in the present embodiment is shown in FIG. 19 and a specific circuit structure thereof is shown in FIG. 20.

Embodiment 6

A description will be given next to an operational amplifier according to the sixth embodiment of the present invention.

Figure 21:
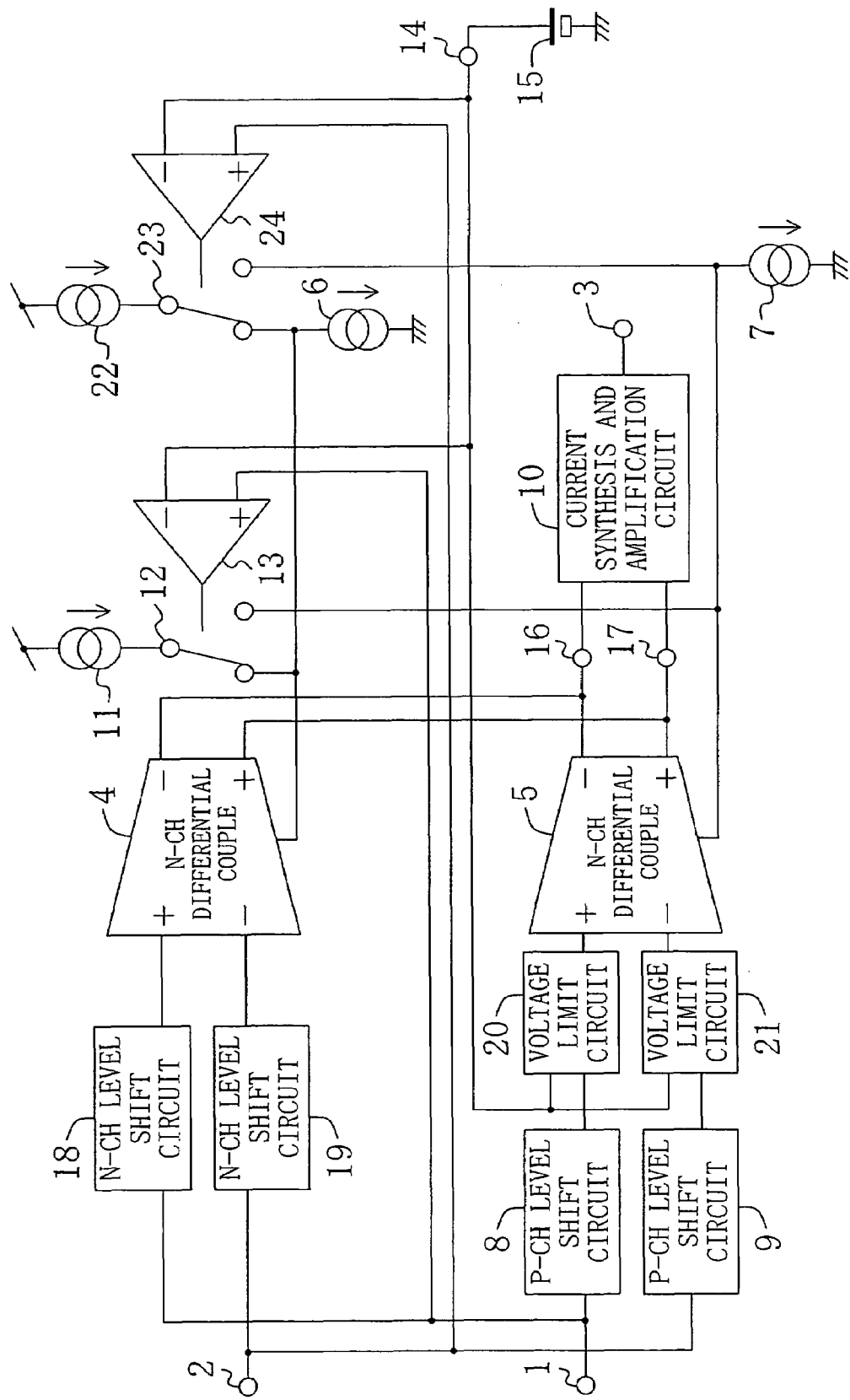
FIG. 21 is a view showing a block structure of an operational amplifier according to a sixth embodiment of the present invention.
Figure 22:
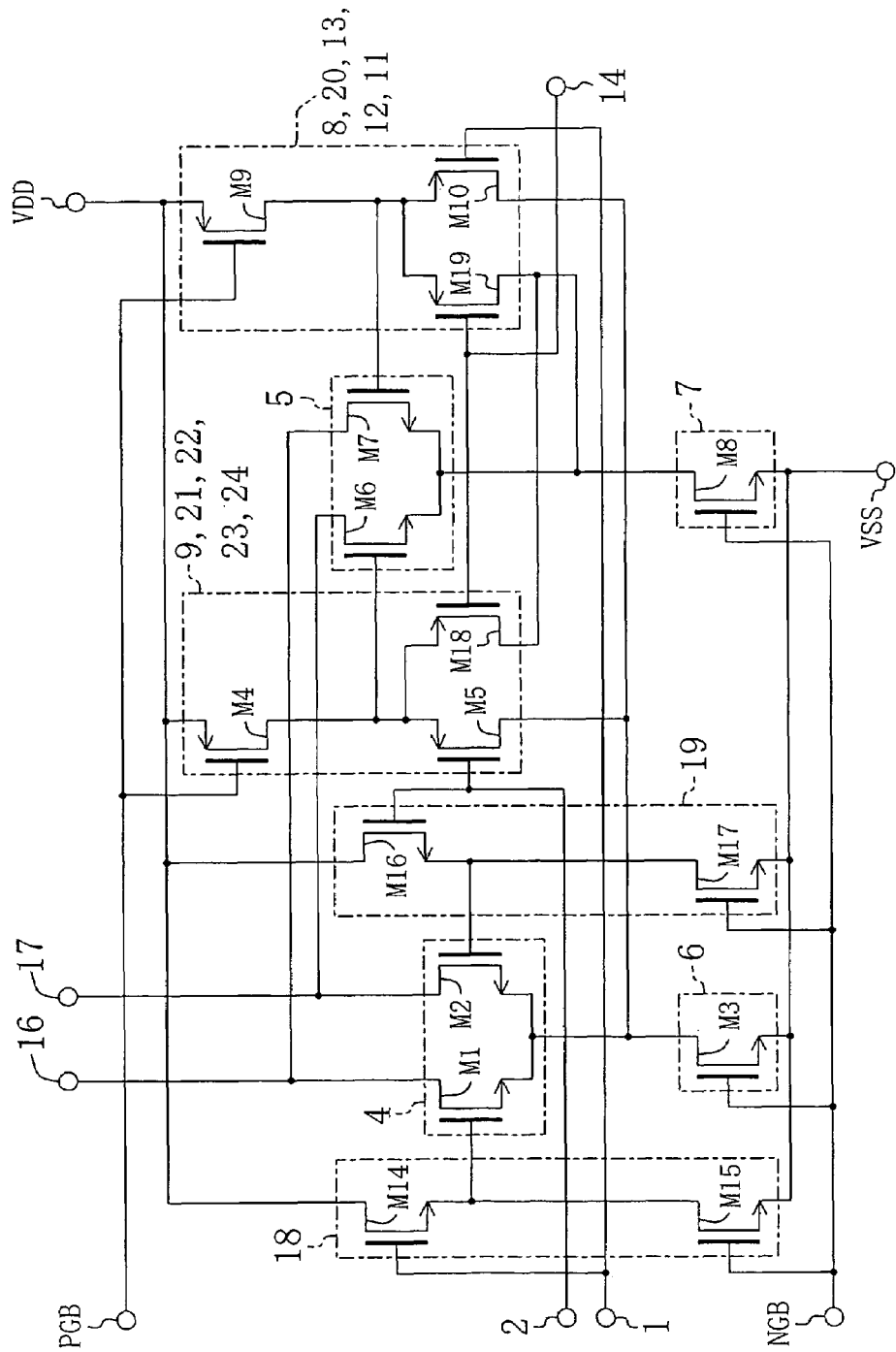
FIG. 22 is a view showing a specific circuit structure of a differential amplifier in the operational amplifier.

FIG. 21 shows a block structure of a differential amplifier according to the present embodiment. The operational amplifier according to the present embodiment is obtained by further adding the fourth current source 22, the second switch circuit 23, and the second comparator 24 to the operational amplifier according to the fourth embodiment shown in FIG. 13 in the same manner as in the fifth embodiment shown in FIG. 17. As for the other structure, it is the same as in the operational amplifier of FIG. 13. FIG. 22 shows a specific circuit structure of the operational amplifier of FIG. 21.

Accordingly, the operation and effect obtained in the present embodiment is a combination of those obtained in the fourth embodiment and those obtained in the fifth embodiment.

Figure 23:
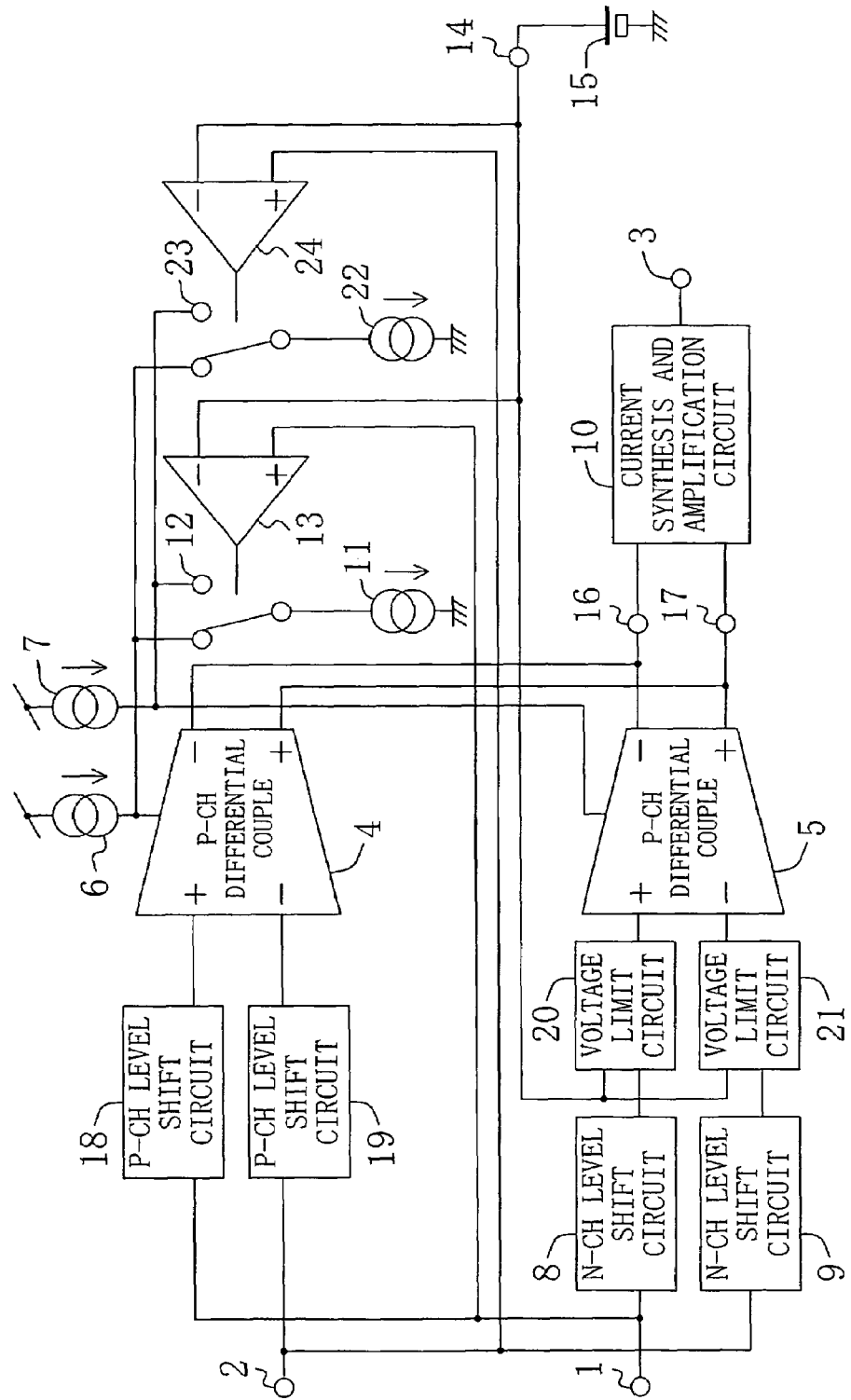
FIG. 23 is a view showing a block structure when the operational amplifier is composed of p-channel MOS transistors.
Figure 24:
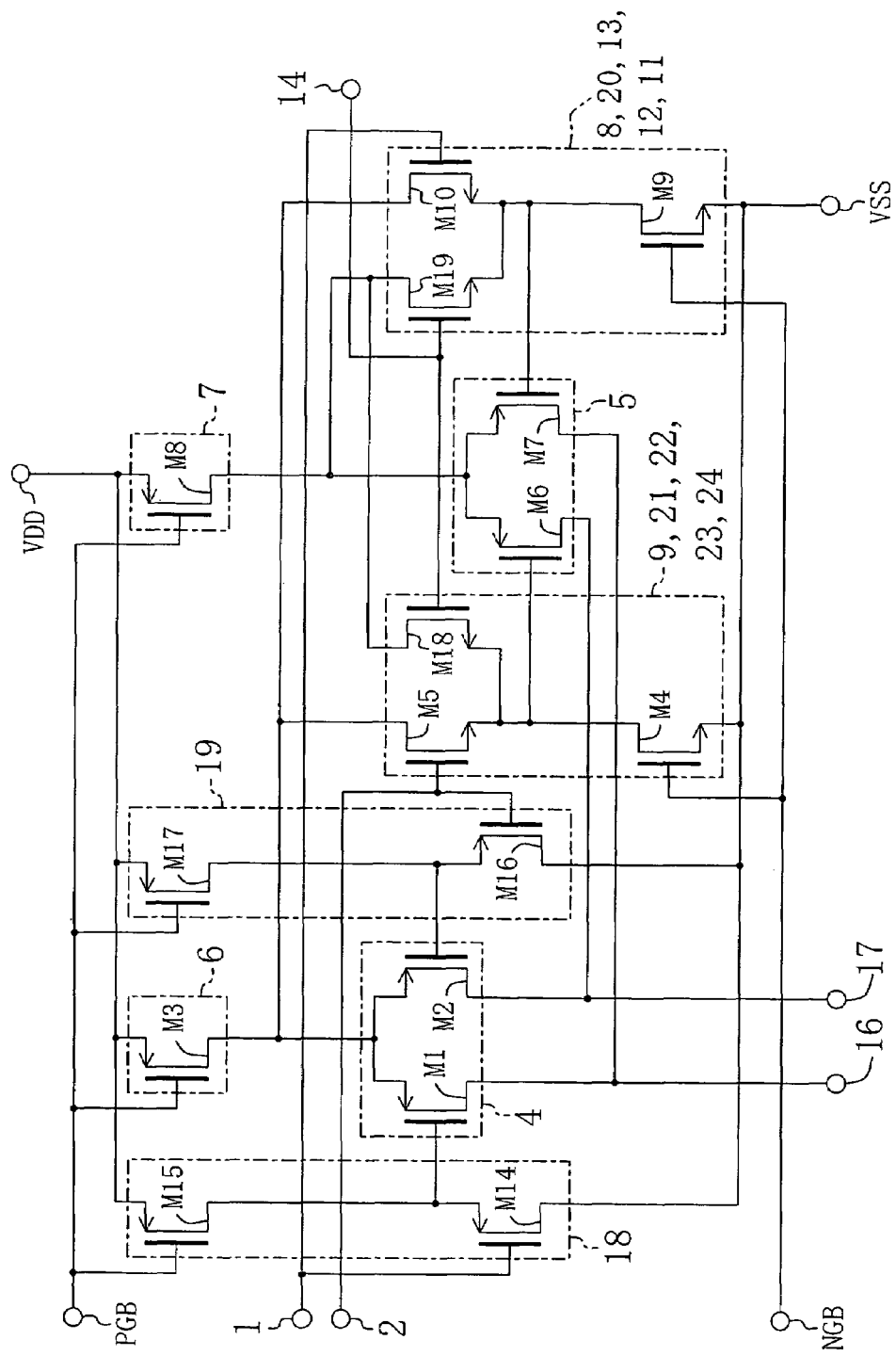
FIG. 24 is a view showing a specific circuit structure of a differential amplifier in the operational amplifier.

A block structure in which the differential couples 4 and 5 are composed of p-channel MOS transistors instead of n-channel MOS transistors as used in the present embodiment is shown in FIG. 23 and a specific circuit structure thereof is shown in FIG. 24.

Embodiment 7

Figure 25:
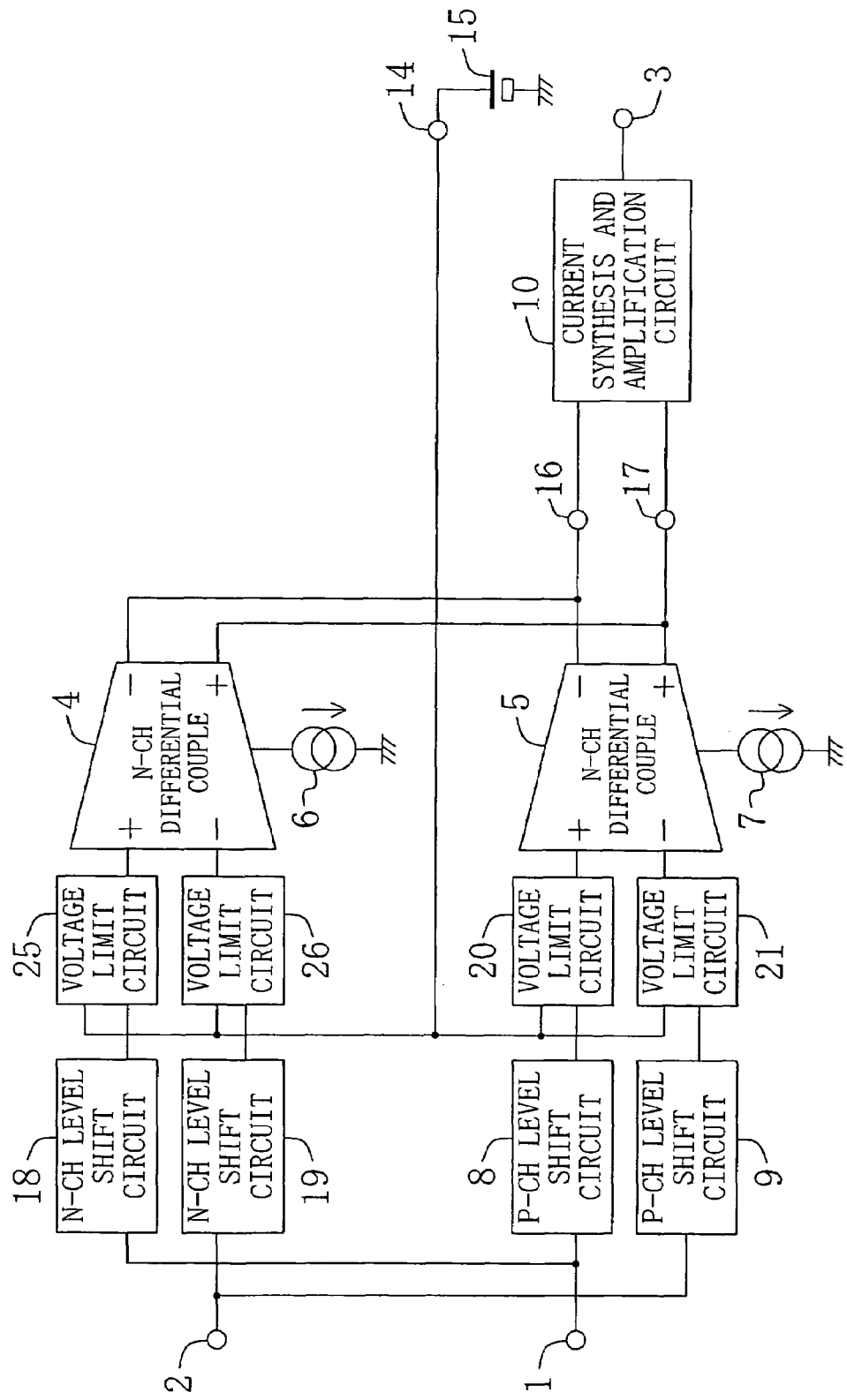
FIG. 25 is a view showing a block structure of an operational amplifier according to a seventh embodiment of the present invention.

An operational amplifier according to a seventh embodiment of the present invention is further shown in FIG. 25. The operational amplifier according to the present embodiment is obtained by removing the third current source 11, the switch circuit 12, and the comparator 13 from the operational amplifier according to the fourth embodiment shown in FIG. 13 and adding the third and fourth voltage limit circuits 25 and 26 instead thereof. In short, the present embodiment has not adopted a structure which causes the current from the third current source 11 to flow in the first or second current source 7 or 6 and thereby cancels the current but has adopted a structure which switches a current converting operation between the first and second differential couples 5 and 4 by using the two pairs of voltage limit circuits 20 and 21 and voltage limit circuits 25 and 26.

The third and fourth voltage limit circuits 25 and 26 limit the voltage of the differential signal level-shifted by the third and fourth level shift circuits 18 and 19 to a value not less than the voltage of the reference voltage source 15 and outputs the differential signal at the limited voltage to the first differential couple 4 such that it is converted to currents.

Figure 26:
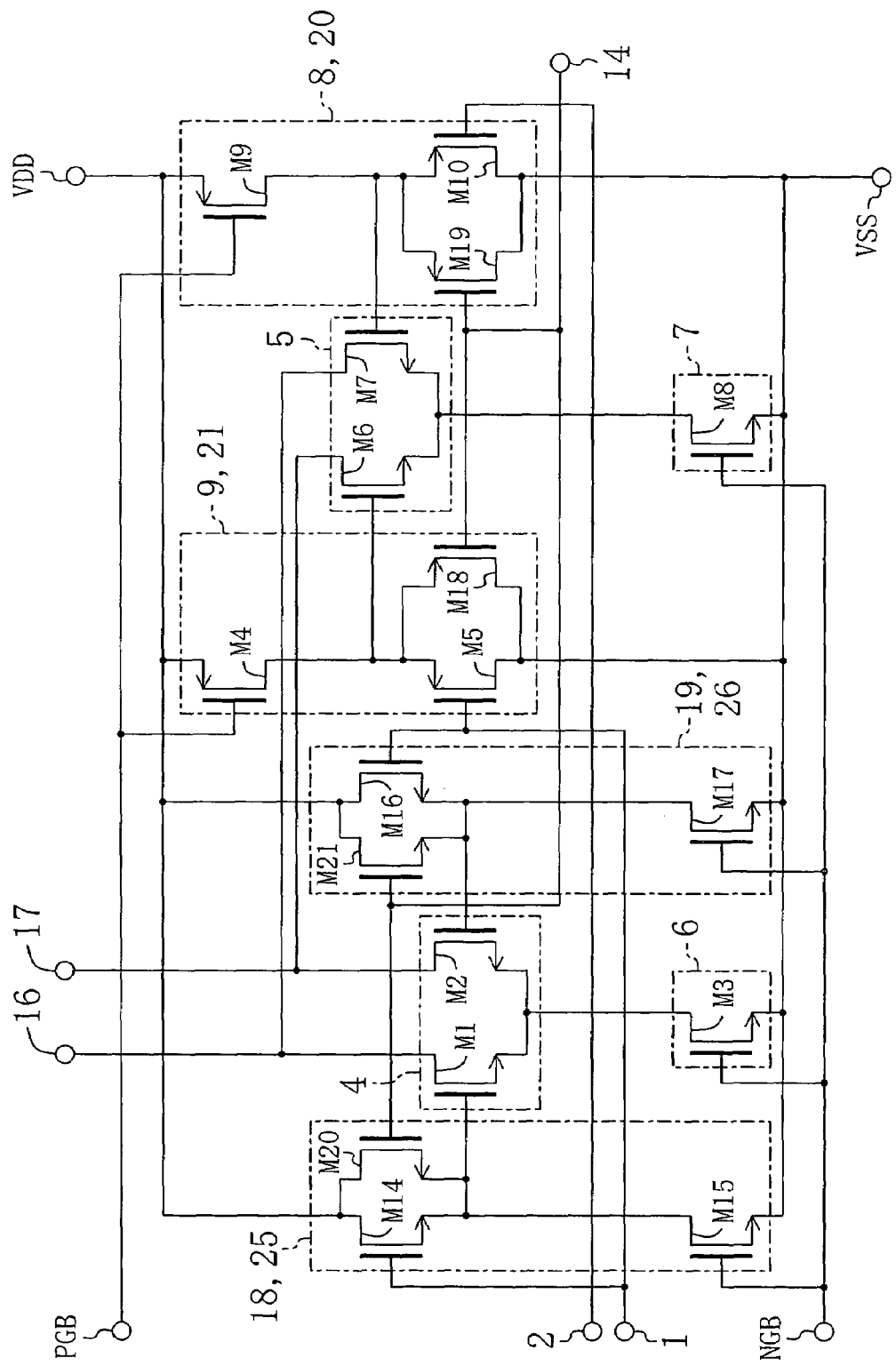
FIG. 26 is a view showing a specific circuit structure of a differential amplifier in the operational amplifier.

FIG. 26 shows a specific circuit structure of the differential amplifier of the operational amplifier shown in FIG. 25. In the drawing, three p-channel MOS transistors M9, M10, and M19 compose the first level shift circuit 8 and the first voltage limit circuit 20, while three p-channel MOS transistors M4, M5, and M18 compose the second level shift circuit 9 and the second voltage limit circuit 21. On the other hand, three n-channel MOS transistors M14, M15, and M20 compose a third level shift circuit 18 and a third voltage limit circuit 25, while three n-channel MOS transistors M16, M17, and M21 compose a fourth level shift circuit 19 and a third voltage limit circuit 26.

The operation of the differential amplifier thus constructed will be described herein below with reference to FIGS. 25 and 26.

In FIG. 25, when the respective voltages of the first and second signals composing the differential signal to the first and second input terminals 1 and 2 are lower than the voltage of the reference voltage source 15, the inputted differential signal passes through the first and second level shift circuits 8 and 9 and further passes through the first and second limit circuits 20 and 21 to be converted to currents by the first differential couple 5. The currents then pass through the current synthesis and amplification circuit 10 to be amplified and outputted from the output terminal 3. On the other hand, the differential signal passes through the third and fourth level shift circuits 18 and 19 but are cut off by the third and fourth voltage limit circuits 25 and 26 so that they do not reach the second differential couple 4. When the voltage of the differential signal is lower than the voltage of the reference voltage source 15, therefore, the conversion rate gm of the differential amplifier is expressed as:

$$gm=gmn$$

where the conductance of each of the n-channel MOS transistors composing the first differential couple 5 is gmn.

When the respective voltages of the first and second signals at the first and second input terminals 1 and 2 are not less than the voltage of the reference voltage source 15, the differential signal passes through the third and fourth level shift circuits 18 and 19 and then pass through the third and fourth voltage limit circuits 25 and 26 to be converted to currents by the second differential couple 4, which is converse to the above. The currents are then amplified through the current synthesis and amplification circuit 10 and outputted from the output terminal 3. On the other hand, the differential signal passes through the first and second level shift circuits 8 and 9 but are cut off by the first and second voltage limit circuits 20 and 21 so that they do not reach the first differential couple 5. When the voltage of the differential signal is not less than the voltage of the reference voltage source 15, therefore, the conversion rate gm of the differential amplifier is expressed as:

$$gm=gmn.$$

Consequently, an equal gain is achieved over the entire range of the input operating voltage.

Subsequently, the operation will be described in greater detail by using FIG. 26. When the voltage of the differential signal at the first and second input terminals 1 and 2 is less than the voltage of the reference voltage source 15, the inputted differential signal passes through the p-channel MOS transistors M5 and M10 and passes through the n-channel MOS transistors M6 and M7 to be outputted as current outputs of the differential amplifier from the output terminals 16 and 17. On the other hand, the n-channel MOS transistors M14 and M16 are cut off so that the differential signal does not pass through the n-channel MOS transistors M1 and M2 composing the second differential couple 4. At this time, the conversion rate gm of the differential amplifier is expressed as $$gm=gmn.$$

When the voltage of the differential signal at the first and second input terminals 1 and 2 is not less than the voltage of the reference voltage source 15, on the other hand, the inputted differential signal passes through the n-channel MOS transistors M14 and M16 and further passes through the n-channel MOS transistors M1 and M2 composing the second differential couple 4 to be outputted as current outputs of the differential amplifier from the output terminals 16 and 17. On the other hand, the p-channel MOS transistors M5 and M10 are cut off so that the differential signal does not pass through the n-channel MOS transistors M6 and M7 composing the first differential couple 5. At this time, the conversion rate gm of the differential amplifier becomes $$gm=gmn.$$

Accordingly, an equal gain is achieved over the entire range of the input operating voltage.

As can be seen from FIG. 26, the two pairs of voltage limit circuits 20 and 21 and voltage limit circuits 25 and 26 are composed of the p-channel MOS transistors M10, M19, M5, and M18 and the n-channel MOS transistors M14, M20, M16, and M21 but do not form a current mirror circuit so that they are capable of performing a high-speed switching operation and the operational amplifier operates at a high speed.

Since the differential signal passes through the first and second level shift circuits 8 and 9 when the voltage thereof is less than the voltage of the reference voltage source 15 and passes through the third and fourth level shift circuits 18 and 19 when the voltage thereof is not less than the voltage of the reference voltage source 15, a gain loss and the degradation of a frequency characteristic become equal over the entire range of the input operating voltage.

In the differential amplifier of FIG. 26, the voltage of the reference voltage source 15 may be determined selectively and appropriately to satisfy operating conditions such that the p-channel MOS transistors M4 and M9 operate in a saturation region and the n-channel MOS transistor M3 operates in a saturation region when the n-channel MOS transistors M1 and M2 operate, while the n-channel MOS transistor M8 operates in a saturation region when the n-channel MOS transistors M6 and M7 operate. An amount of voltage level-shifted by the p-channel MOS transistors M5 and M10 is determined by selectively and appropriately determining the respective gate widths and gate lengths of the p-channel MOS transistors M5 and M10 and the n-channel MOS transistors M6 and M7 such that the n-channel MOS transistor M8 operates in saturation. Further, an amount of voltage level-shifted by the n-channel MOS transistors M14 and M16 is determined by selectively and appropriately determining the respective gate widths and gate lengths of the n-channel MOS transistors M14 and M16 and the n-channel MOS transistors M1 and M2 such that the n-channel MOS transistor M3 operates in saturation.

Figure 27:
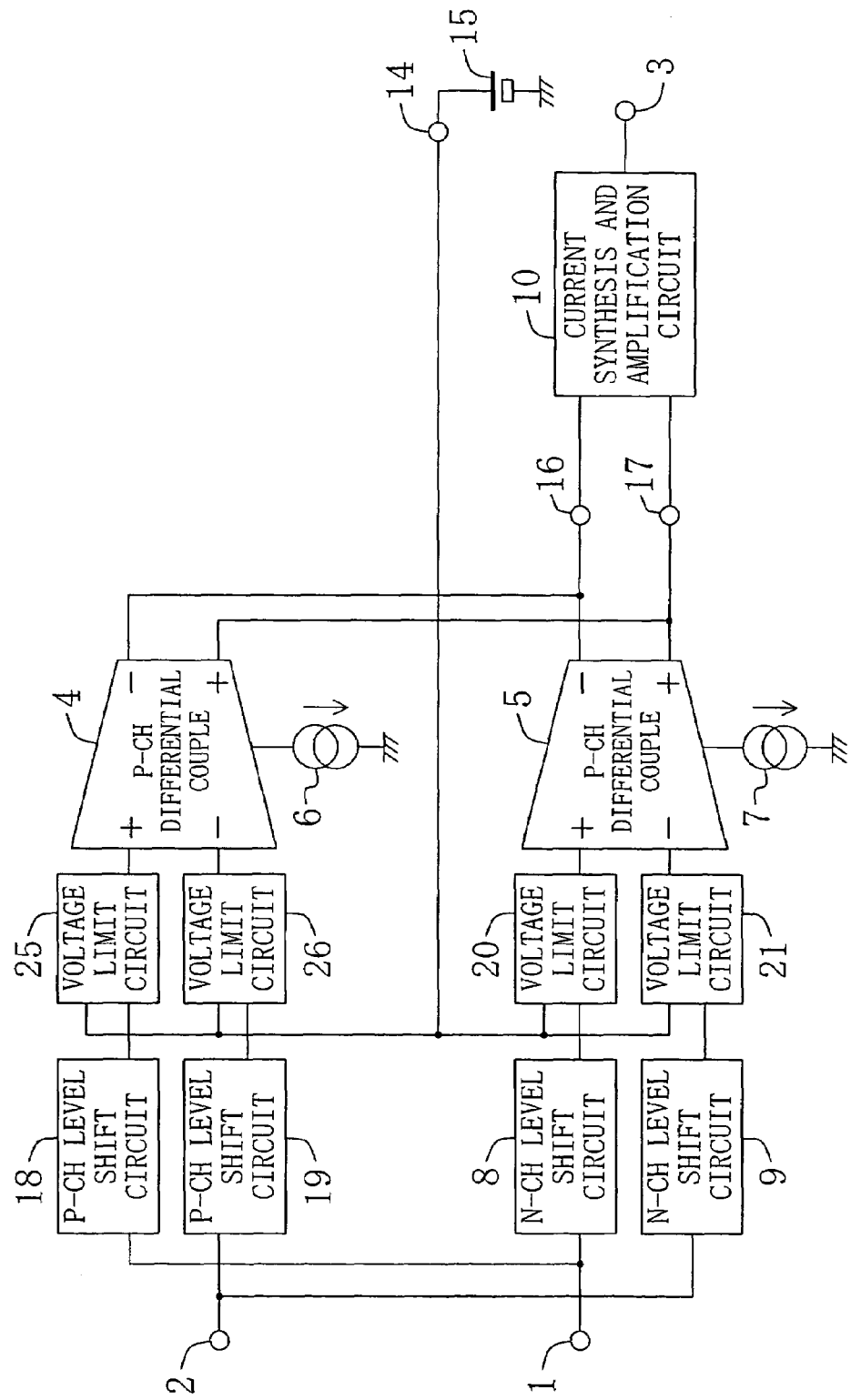
FIG. 27 is a view showing a block structure when the operational amplifier is composed of p-channel MOS transistors.
Figure 28:
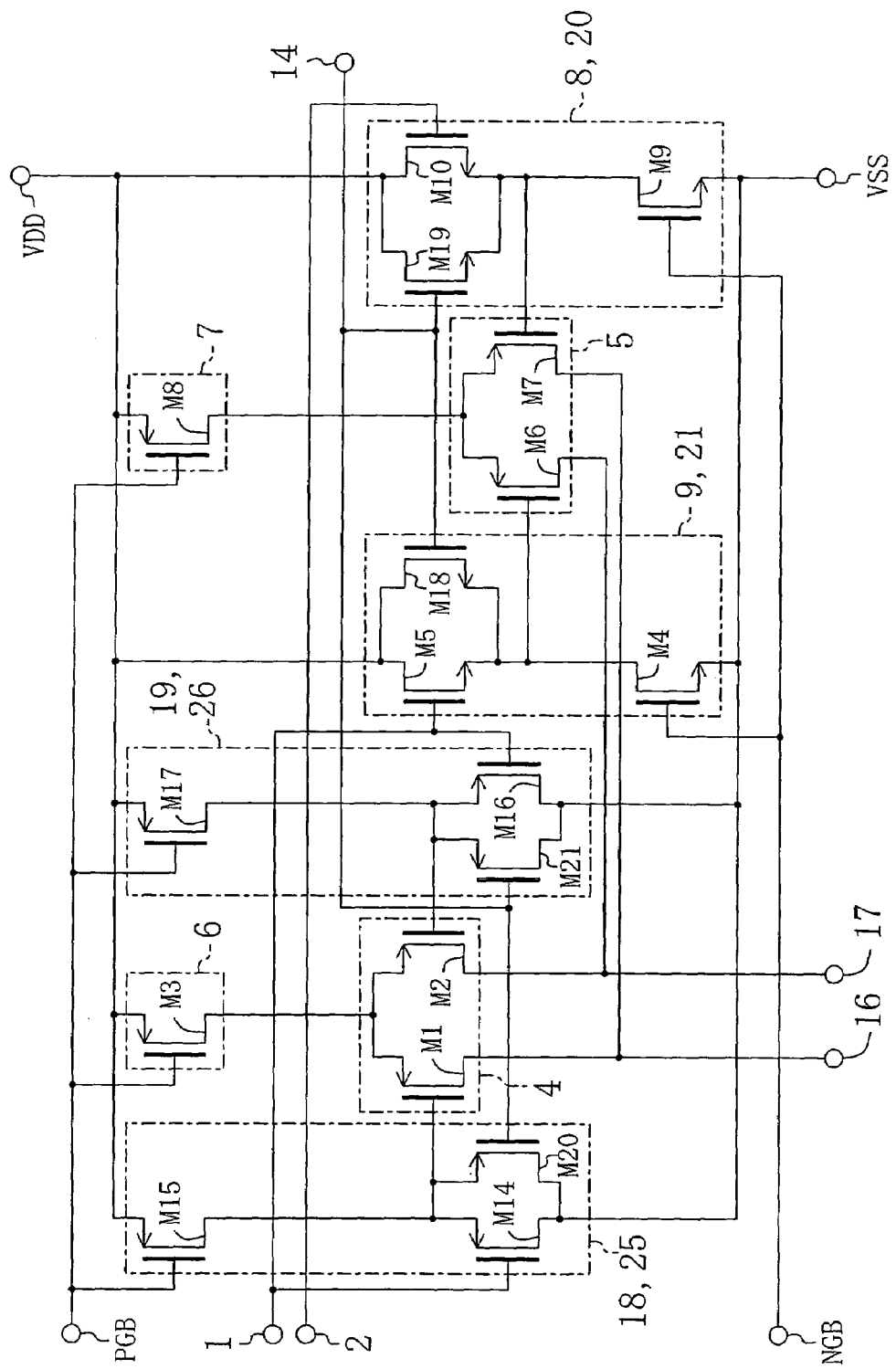
FIG. 28 is a view showing a specific circuit structure of a differential amplifier in the operational amplifier.
Figure 29:
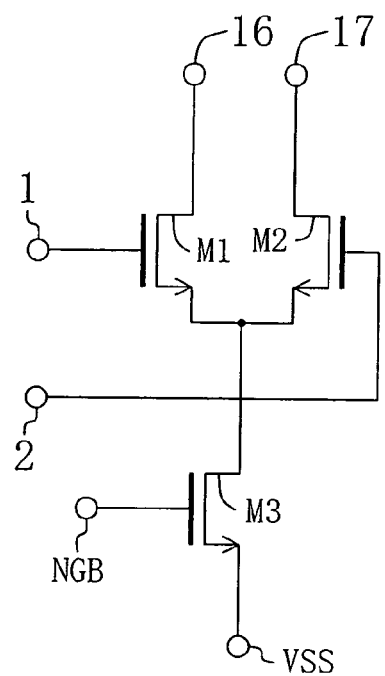
FIG. 29 is a view showing a circuit structure of a differential amplifier of Document 1.
Figure 30:
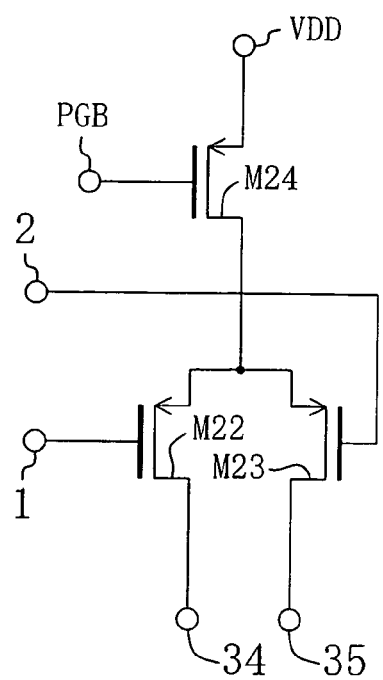
FIG. 30 is a view showing a circuit in which the differential amplifier is composed of p-channel MOS transistors.
Figure 31:
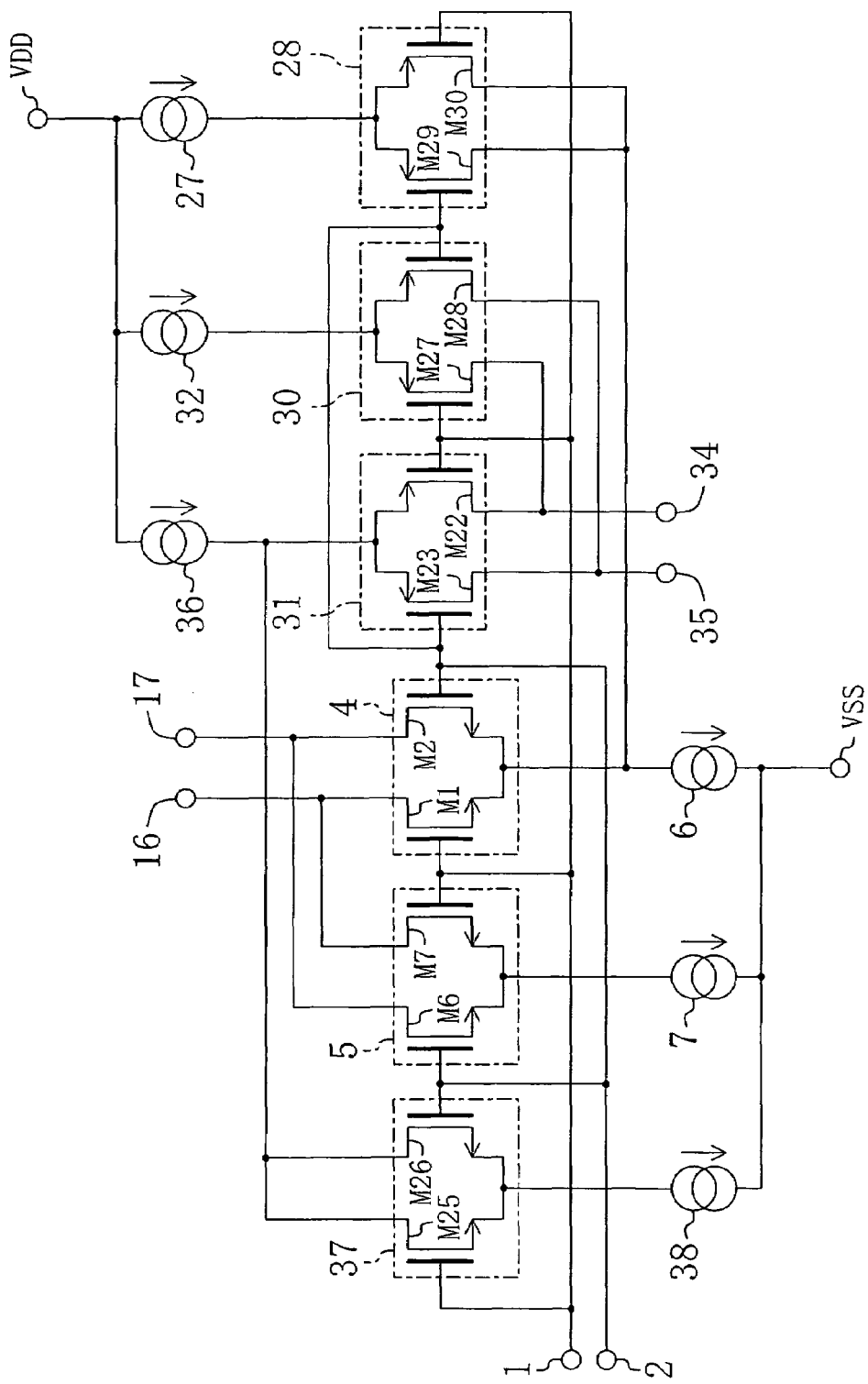
FIG. 31 is a view showing a specific circuit structure of an amplifier of Document 3.
Figure 32:
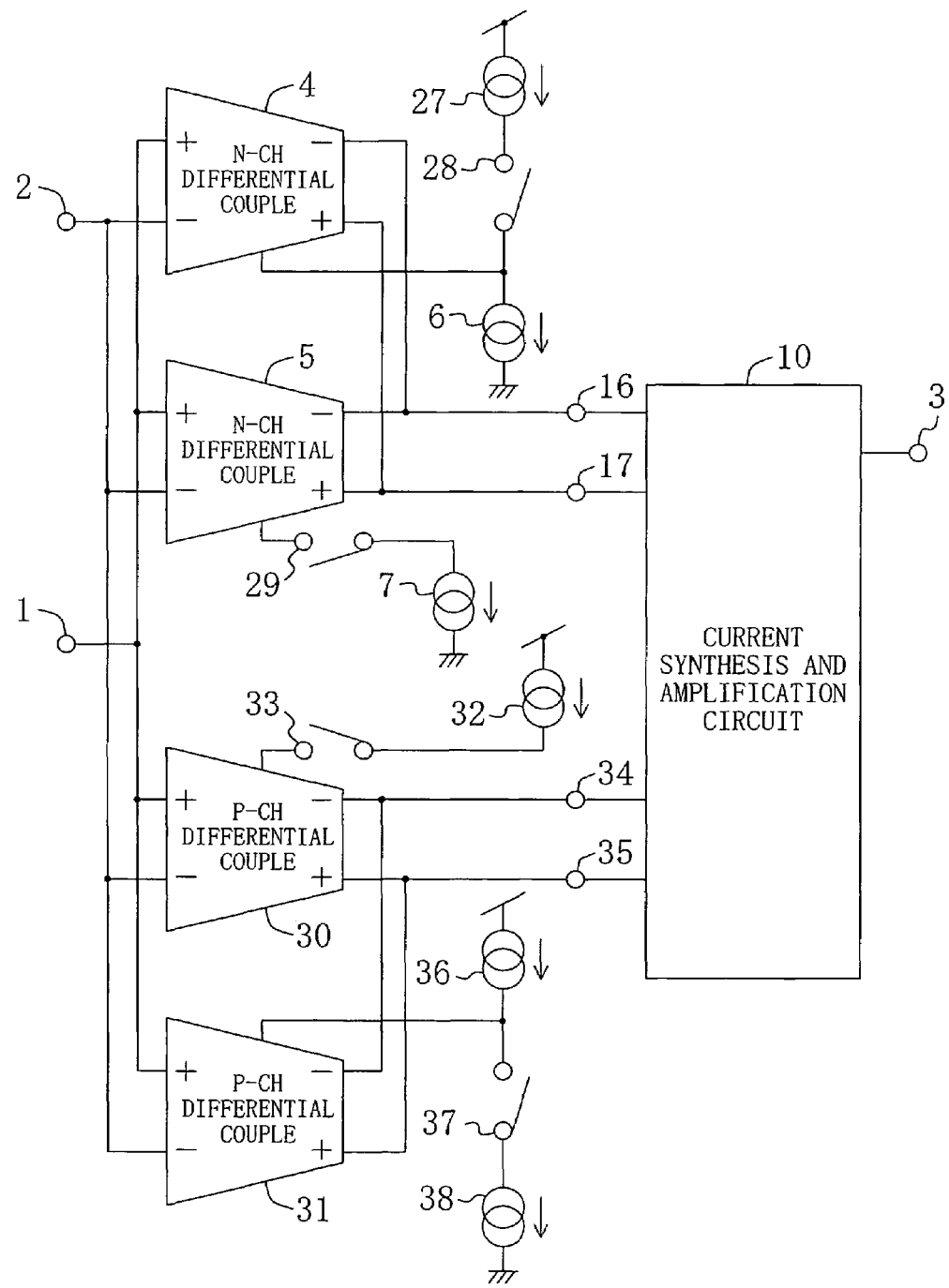
FIG. 32 is a view showing a block circuit structure of the amplifier.
Figure 33:
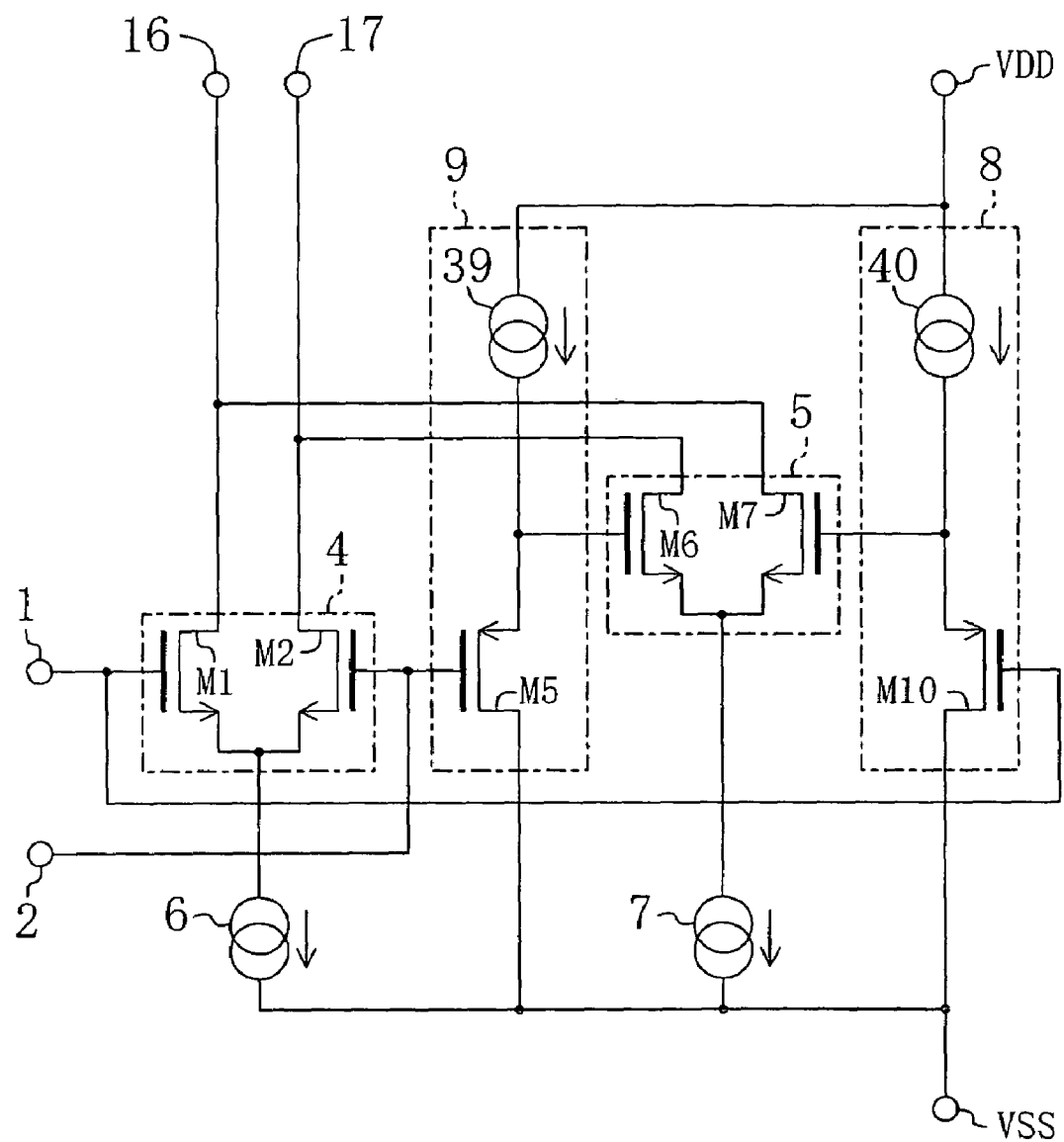
FIG. 33 is a view showing a specific circuit structure of an amplifier of Document 4.
Figure 34:
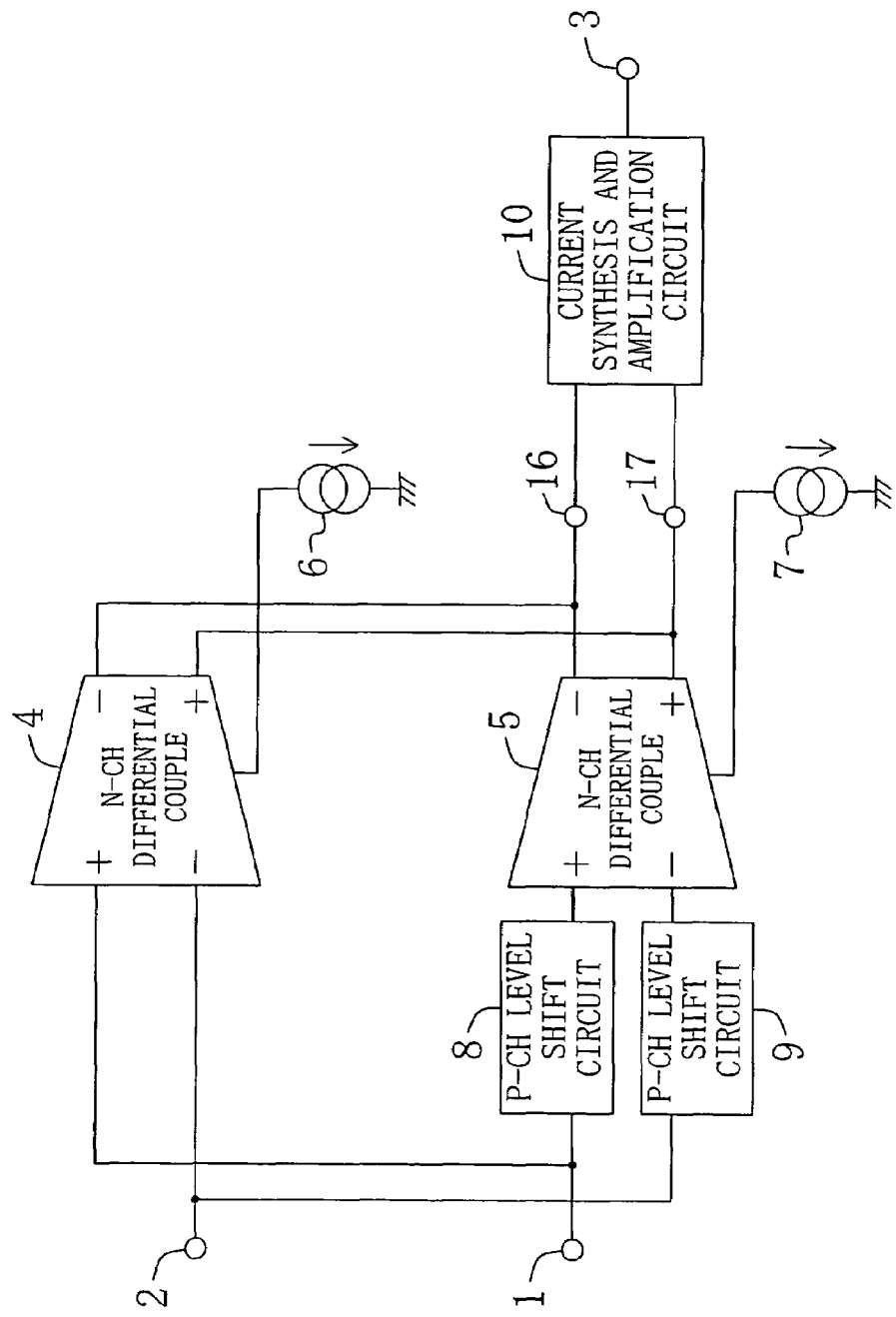
FIG. 34 is a view showing a block circuit structure of the amplifier.
Figure 35:
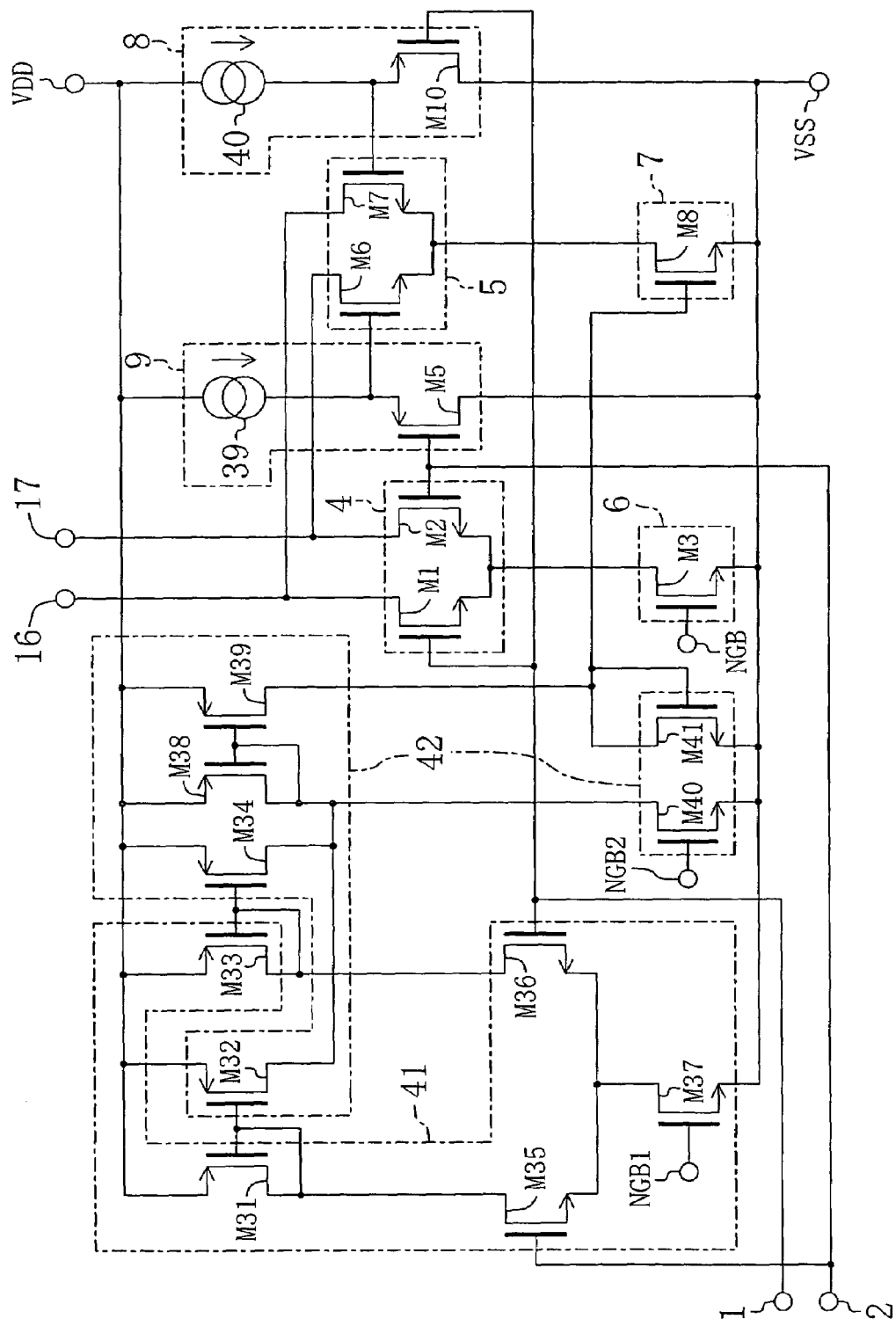
FIG. 35 is a view showing a specific circuit structure of an amplifier of Document 5.
Figure 36:
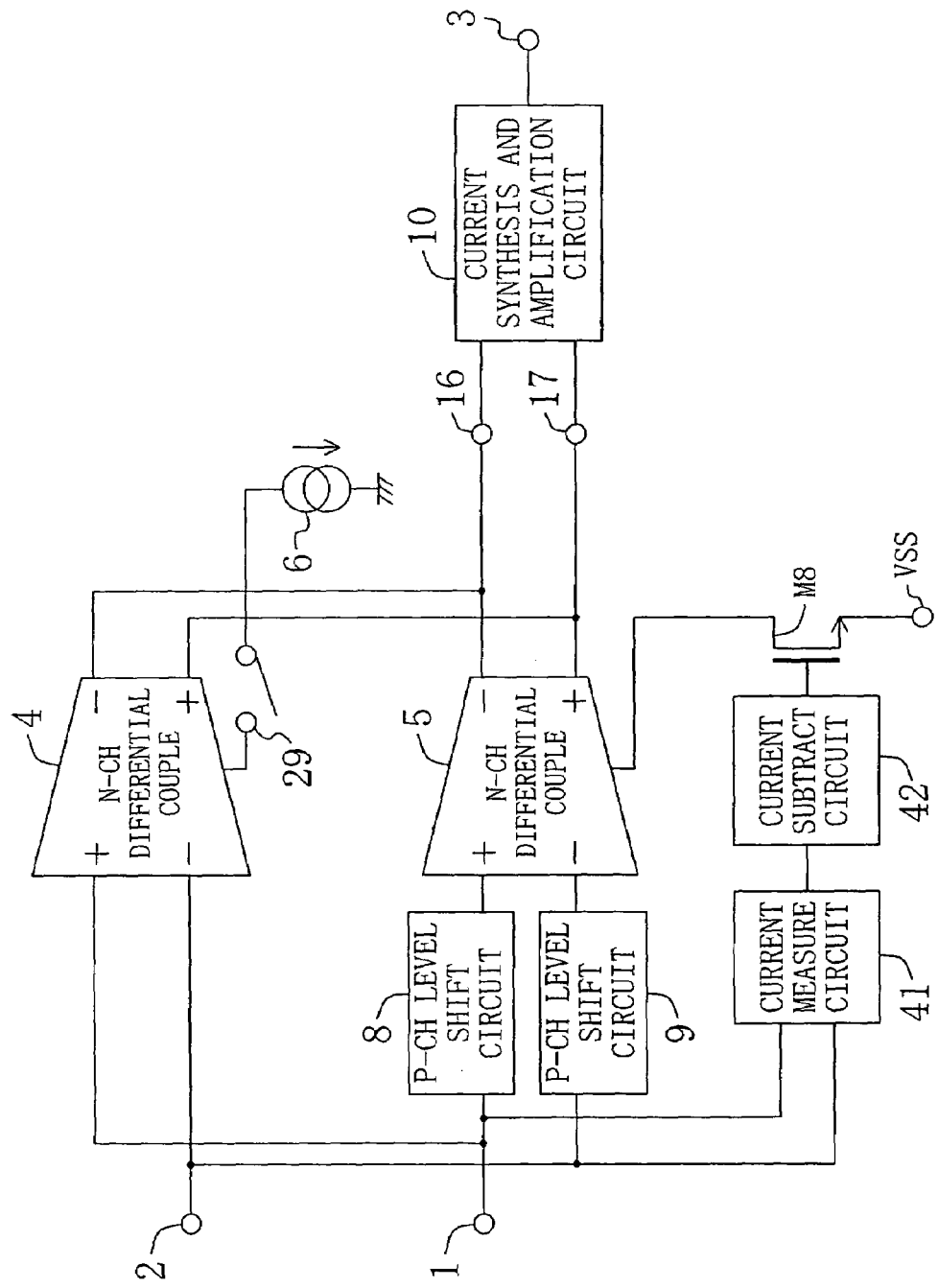
FIG. 36 is a view showing a block circuit structure of the amplifier.

A block structure in which the differential couples 4 and 5 are composed of p-channel MOS transistors instead of n-channel MOS transistors as used in the present embodiment is shown in FIG. 27 and a specific circuit structure thereof is shown in FIG. 28.

INDUSTRIAL APPLICABILITY

As described above, the present invention is applied preferably to a differential amplifier or an operational amplifier since it allows the implementation of a differential amplifier and an operational amplifier each having an equal gain over the entire range of the input operating voltage and capable of a high-speed operation.

What is claimed is:

1. A differential amplifier comprising:
    first and second input terminals to which a differential signal composed of first and second signals is inputted;
    first and second level shift circuits for shifting respective voltages of the first and second signals inputted to the first and second input terminals;
    a reference voltage source;
    first and second voltage limit circuits for limiting the voltage of the differential signal level-shifted by the first and second level shift circuits with a voltage of the reference voltage source;
    a first differential couple and a first current source for converting the differential signal having the voltage limited by the first and second voltage limit circuits to currents;
    a second differential couple and a second current source for converting the differential signal inputted to the first and second input terminals to currents;
    a third current source;
    a comparator for comparing the voltage of the first or second signal inputted to the first or second input terminal with the voltage of the reference voltage source;
    a switch circuit for selectively supplying a current from the third current source to the first or second current source depending on a result of the comparison by the comparator; and
    first and second output terminals to which an output of the first differential couple and an output of the second differential couple are connected commonly.

2. The differential amplifier of claim 1, further comprising:
    third and fourth level shift circuits for shifting the respective voltages of the first and second signals inputted to the first and second input terminals, wherein
    the second differential couple and the second current source convert the differential signal level-shifted by the third and fourth level shift circuits to currents instead of the differential signal inputted to the first and second input terminals.

3. The differential amplifier of claim 1, further comprising:
    a fourth current source;
    a second comparator for comparing the voltage of the first or second signal inputted to the first or second input terminal with the voltage of the reference voltage source; and
    a second switch circuit for selectively supplying a current from the fourth current source to the first current source or the second current source depending on a result of comparison by the second comparator.

4. The differential amplifier of claim 2, further comprising:
    a fourth current source;
    a second comparator for comparing the voltage of the first or second signal inputted to the first or second input terminal with the voltage of the reference voltage source; and
    a second switch circuit for selectively supplying a current from the fourth current source to the first current source or the second current source depending on a result of comparison by the second comparator.

* * * * *